(12) United States Patent
Akiyama et al.

(10) Patent No.: US 7,701,236 B2
(45) Date of Patent: Apr. 20, 2010

(54) EACH INSPECTION UNITS OF A PROBE APPARATUS IS PROVIDED WITH AN IMAGING UNIT TO TAKE AN IMAGE OF A WAFER

(75) Inventors: Shuji Akiyama, Nirasaki (JP); Tadashi Obikane, Nirasaki (JP); Masaru Suzuki, Nirasaki (JP); Yasuhito Yamamoto, Nirasaki (JP); Kazuya Yano, Nirasaki (JP); Yuji Asakawa, Nirasaki (JP); Kazumi Yamagata, Nirasaki (JP); Shigeki Nakamura, Nirasaki (JP); Eiichi Matsuzawa, Nirasaki (JP); Kazuhiro Ozawa, Nirasaki (JP); Fumito Kagami, Nirasaki (JP); Shinji Kojima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 12/120,546

(22) Filed: May 14, 2008

(65) Prior Publication Data
US 2008/0290886 A1 Nov. 27, 2008

(30) Foreign Application Priority Data
May 15, 2007 (JP) ............................. 2007-128694
Sep. 28, 2007 (JP) ............................. 2007-256804

(51) Int. Cl.
*G01R 1/073* (2006.01)
*G01R 31/28* (2006.01)

(52) U.S. Cl. .................................... 324/758; 324/158.1

(58) Field of Classification Search ........................ None
See application file for complete search history.

(56) References Cited

U.S. PATENT DOCUMENTS

| | | | | |
|---|---|---|---|---|
| 4,266,191 A | * | 5/1981 | Spano et al. ................. | 324/758 |
| 4,677,474 A | * | 6/1987 | Sato et al. ..................... | 348/87 |
| 5,113,132 A | * | 5/1992 | Hoshi .......................... | 324/758 |
| 5,264,918 A | * | 11/1993 | Kagami ........................ | 356/400 |
| 5,404,111 A | * | 4/1995 | Mori et al. .................... | 324/758 |
| 5,510,724 A | * | 4/1996 | Itoyama et al. ............... | 324/760 |
| 5,614,837 A | * | 3/1997 | Itoyama et al. ............... | 324/760 |
| 5,644,245 A | * | 7/1997 | Saitoh et al. .................. | 324/754 |
| 5,691,764 A | * | 11/1997 | Takekoshi et al. ............. | 348/86 |
| 6,577,382 B2 | * | 6/2003 | Kida et al. .................... | 355/77 |
| 6,675,666 B2 | * | 1/2004 | Maruyama et al. .......... | 73/865.8 |
| 7,063,598 B2 | * | 6/2006 | Isobe et al. .................... | 451/54 |
| 7,153,087 B2 | * | 12/2006 | Kang et al. ................... | 414/781 |
| 2008/0088833 A1 | * | 4/2008 | Yokota et al. ............ | 356/237.5 |

* cited by examiner

*Primary Examiner*—Paresh Patel
(74) *Attorney, Agent, or Firm*—Oblon, Spivak, McClelland, Maier & Neustadt, L.L.P.

(57) ABSTRACT

A prove apparatus includes a first and a second loading port for mounting therein two carriers facing each other, a wafer transfer mechanism having a rotation center between the loading ports, and a first and a second inspection unit being symmetrical to each other and disposed in accordance with the arrangement of the loading ports. In this configuration, wafers are directly transferred between the carrier and a wafer chuck of the inspection unit by the wafer transfer mechanism. The wafer transfer mechanism has three arms for unloading two wafers from the carrier. The prove apparatus has a compact size and achieves a high throughput.

17 Claims, 38 Drawing Sheets

FIG.12
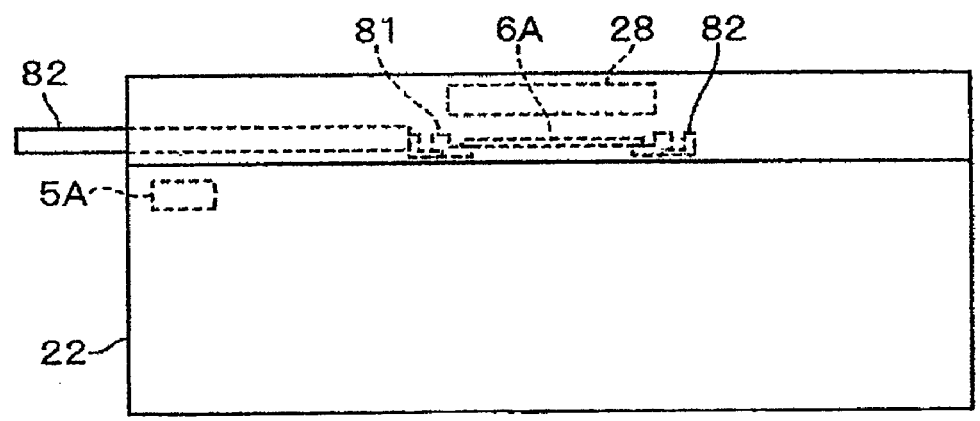
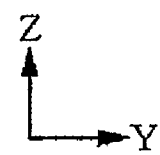
FIG.13
(PRIOR ART)
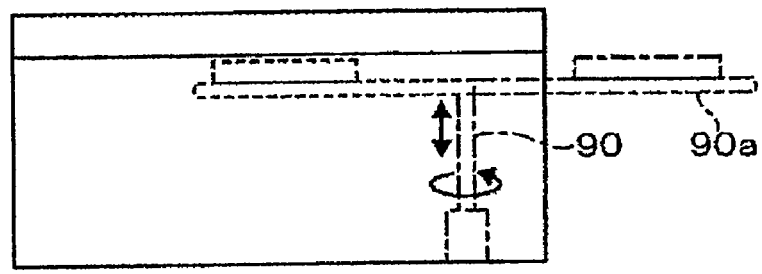

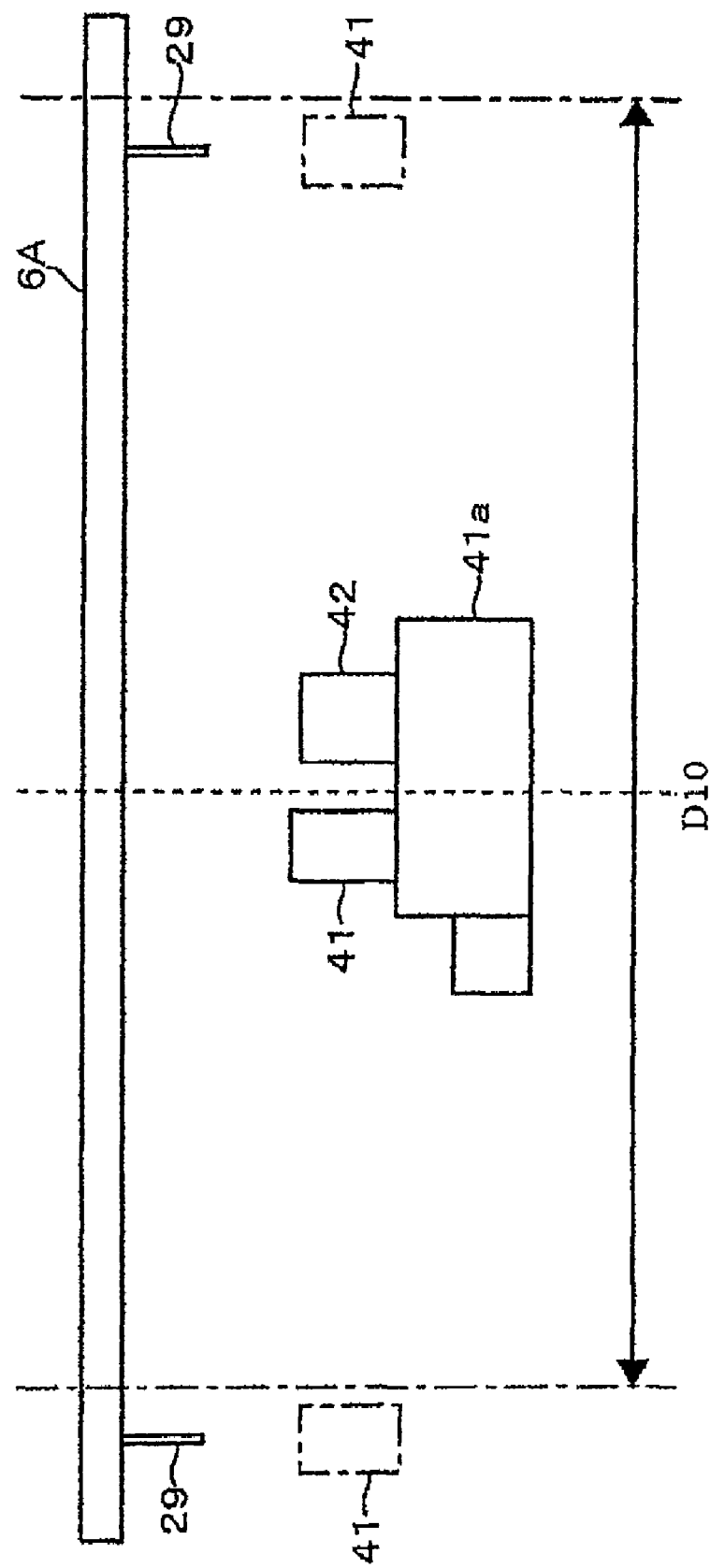

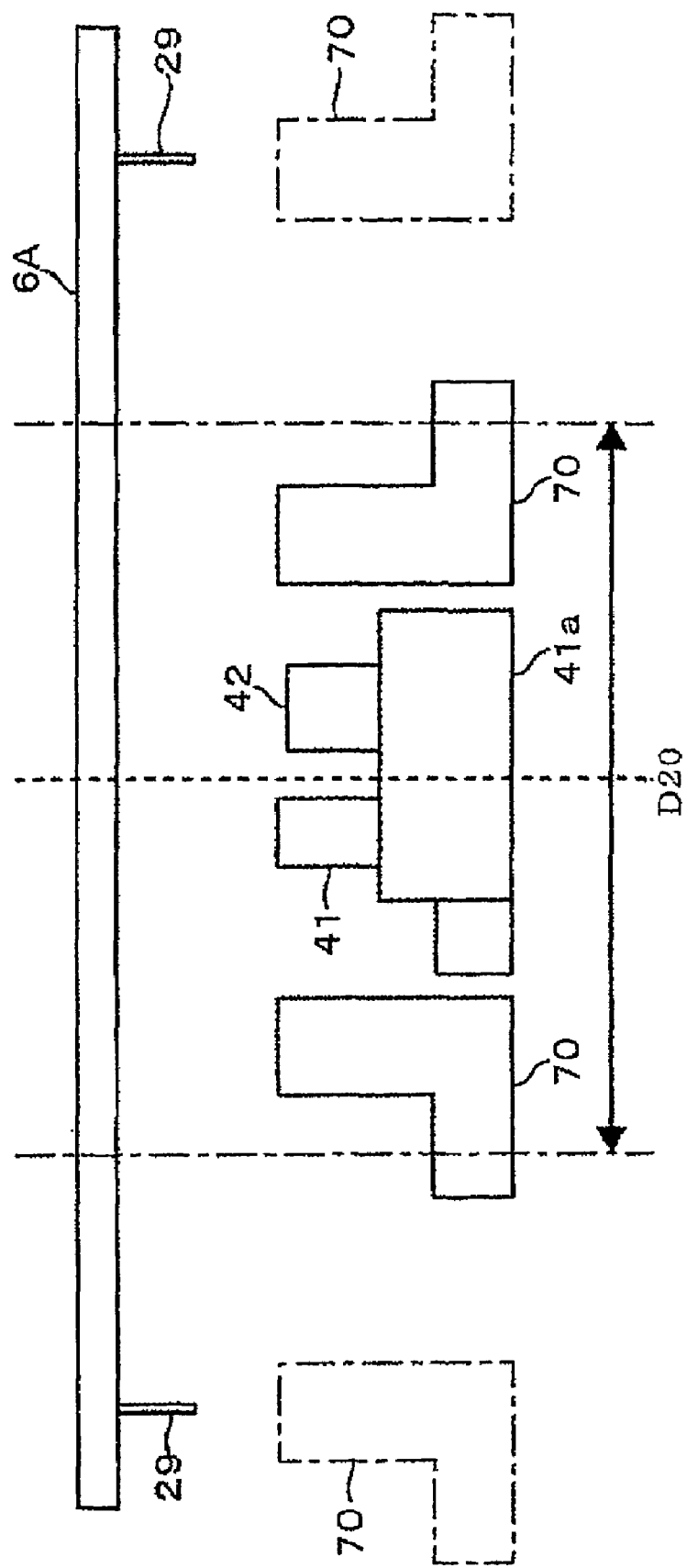

FIG. 33

| 3Arm Event | Stage1 | UpperArm | MiddleArm | LowerArm | Stage2 |
|---|---|---|---|---|---|
| LotStart | | Waf.2 | Waf.1 | | |
| Waf.1Start Waf.2Start | Waf.1 Alignment Test | Waf.4 | Waf.3 | | Waf.2 Alignment Test |
| Waf.1End | | | | Waf.1 | |
| Waf.3Start Waf.2End | Waf.3 Alignment Test | | Waf.5 | Carrier Waf.2 | |
| Waf.4Start Waf.3End | | Waf.6 | | Carrier Waf.3 | Waf.4 Alignment Test |
| Waf.5Start Waf.4End | Waf.5 Alignment Test | | Waf.7 | Carrier Waf.4 | |
| Waf.6Start Waf.5End | | Waf.8 | | Carrier Waf.5 | Waf.6 Alignment Test |
| Waf.7Start Waf.6End | Waf.7 Alignment Test | | Waf.9 | Carrier Waf.6 | |
| Waf.8Start Waf.7End | | Waf.10 | | Carrier Waf.7 | Waf.8 Alignment Test |
| Waf.9Start Waf.8End | Waf.9 Alignment Test | | Waf.11 | Carrier Waf.8 | |
| Waf.10Start | | Waf.12 | | Carrier | Waf.10 Alignment Test |
| Stage1AssistOccur Waf.10End | | | | Waf.10 Carrier Waf.9 | Waf.12 Alignment Test |
| Stage1Assist Release Waf.9End | Waf.11 Alignment Test | Waf.13 | Waf.14 | Carrier | |

FIG. 34
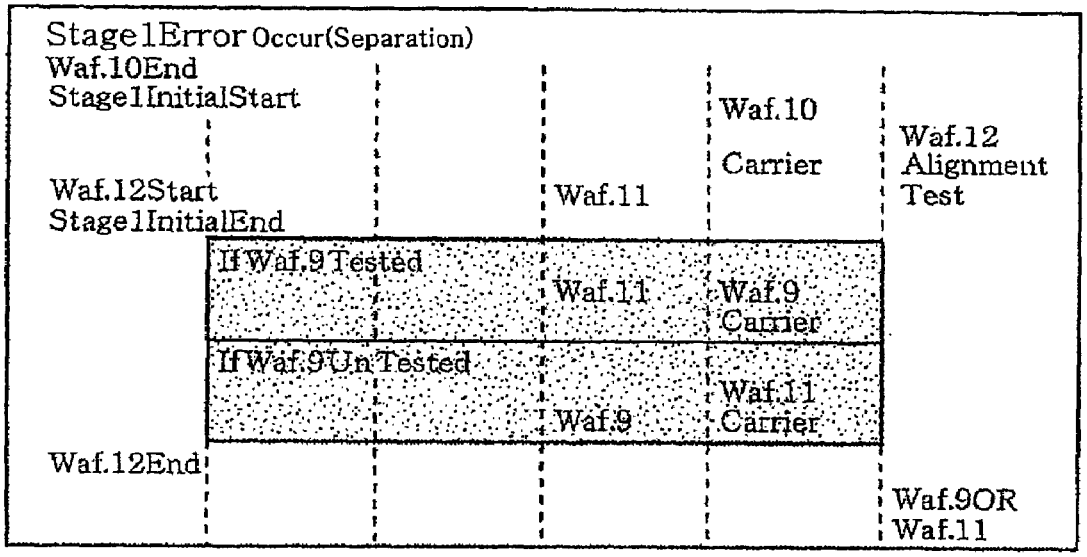
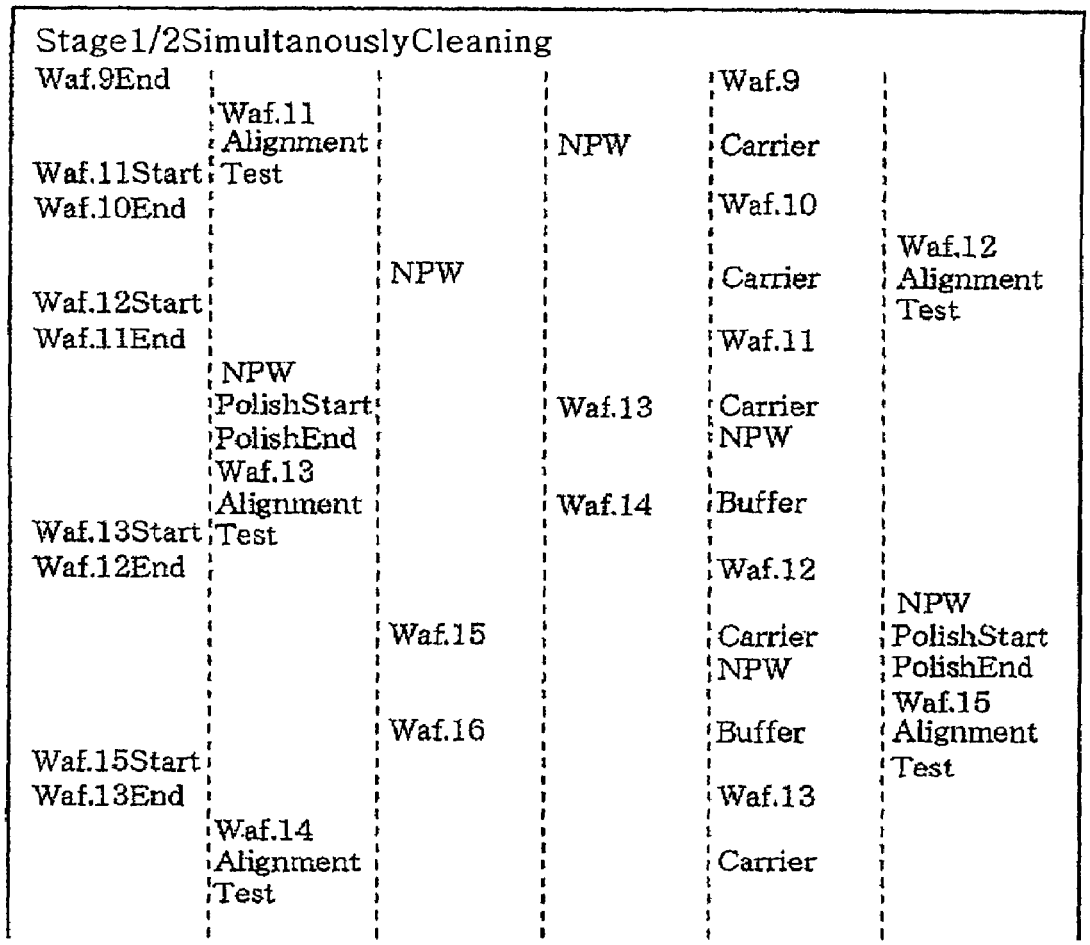

FIG.35

| 2Arm Event | Stage1 | UpperArm | LowerArm | Stage2 |
|---|---|---|---|---|
| LotStart | | Waf.1 | | |
| Waf.1Start | Waf.1 Alignment Test | Waf.2 | | |
| Waf.2Start Waf.1End | | Waf.3 | Waf.1 | Waf.2 Alignment Test |
| Waf.3Start Waf.2End | Waf.3 Alignment Test | Waf.4 | Carrier Waf.2 | |
| Waf.4Start Waf.3End | | Waf.5 | Carrier Waf.3 | Waf.4 Alignment Test |
| Waf.5Start Waf.4End | Waf.5 Alignment Test | Waf.6 | Carrier Waf.4 | |
| Waf.6Start Waf.5End | | Waf.7 | Carrier Waf.5 | Waf.6 Alignment Test |
| Waf.7Start Waf.6End | Waf.7 Alignment Test | Waf.8 | Carrier Waf.6 | |
| Waf.8Start Waf.7End | | Waf.9 | Carrier Waf.7 | Waf.8 Alignment Test |
| Waf.9Start Waf.8End | Waf.9 Alignment Test | Waf.10 | Carrier Waf.8 | |
| Waf.10Start | | Waf.11 | Carrier | Waf.10 Alignment Test |
| Stage1Assist Occur Waf.10End | | Waf.11 OF Change Waf.10 Waf.12 OF Determination | | |
| Stage1Assist Release Waf.9End | | Waf.12 OF Change Waf.9 | | Waf.11 Alignment Test |
| | Waf.12 Alignment Test | Waf.13 | | |

EACH INSPECTION UNITS OF A PROBE APPARATUS IS PROVIDED WITH AN IMAGING UNIT TO TAKE AN IMAGE OF A WAFER

FIELD OF THE INVENTION

The present invention relates to a technique for measuring electrical characteristics of a target object to be inspected by bringing probes into electrical contact with electrode pads of the target object.

BACKGROUND OF THE INVENTION

After IC chips are formed on a semiconductor wafer (hereinafter, referred to as "wafer"), a probe test is performed on the wafer by using a probe apparatus in order to inspect electrical characteristics of the IC chips. The probe apparatus is configured to control a position of a wafer chuck which moves in X, Y and Z directions and rotates about a Z axis so that probes, i.e., probe needles, of a probe card are brought into contact with electrode pads of the IC chips of the wafer, the probe card being provided above the wafer chuck which mounts thereon the wafer.

In order to make the probes precisely contact with the electrode pads of the IC chips on the wafer, first, the wafer surface is imaged by a camera provided in the probe apparatus and, also, the probes are imaged by a camera provided at, e.g., the wafer chuck side. Next, based on the imaged positions of the wafer chuck, a so-called fine alignment is performed to calculate a position of the wafer chuck at which the electrode pads contact with the probes. In order to perform the fine alignment, a movement region of the wafer chuck needs to be ensured. However, as the wafer is scaled up, the movement region is expanded, so that the apparatus is scaled up. Further, the expansion of the movement region of the wafer chuck increases movement time and alignment time. Meanwhile, a demand for an improvement of throughput leads to a development of a loader unit capable of loading a plurality of carriers or a common loader unit shared by a plurality of inspection units. However, there is a trade-off relationship between a high throughput and a large occupation area of the apparatus.

As for a conventional probe apparatus aimed to provide a high throughput, there is known an apparatus described in Japanese Patent Laid-open Publication No. H6-66365 (Especially, FIG. 1). In this apparatus, two inspection units including a wafer chuck, a probe card and the like are connected to both sides of a loader unit. Since, however, the inspection units are not designed to be scaled down, the inspection units installed at both sides of the loader unit increase the occupation area of the probe apparatus. Further, the wafer transfer deteriorates due to the presence of a pincette for transferring a wafer from/to a carrier loaded into the loader unit and two swing arms for transferring the wafer between the pincette and the two inspection units, the pincette being movable in a longitudinal direction of the loader unit. Moreover, the moving paths of the swing arms need to be ensured, so that the apparatus cannot be scaled down.

SUMMARY OF THE INVENTION

In view of the above, the present invention provides a miniaturized probe apparatus capable of providing a high throughput.

In accordance with an aspect of the present invention, there is provided a probe apparatus for inspecting a plurality of chips to be inspected by mounting on a horizontally and vertically movable substrate mounting table a substrate on which the chips are arranged and then contacting probes of a probe card with electrode pads of the chips, the probe apparatus including: a loader unit for loading the substrate; and a probe apparatus main body, provided near the loader unit, for inspecting the chips of the substrate.

The loader unit includes: a first and a second loading port which mount therein two carriers such that transfer opening are spaced apart opposite to each other, the carriers having therein a plurality of substrates and being loaded from the outside; and a substrate transfer mechanism having a rotation center between the first and the second loading port, the substrate transfer mechanism being rotatable about a vertical axis and movable back and forth and up and down.

The probe apparatus main body includes a first and a second inspection unit disposed in accordance with the arrangement of the first and the second loading port and provided at both sides of a horizontal line perpendicular to a line which connects the first and the second loading port and passes through the rotation center.

Each of the inspection units is provided with the substrate mounting table, the probe card and an imaging unit having a substrate imaging device which has a downward view to take an image of a surface of the substrate and is movable horizontally at a height position between the substrate mounting table and the probe card.

The substrate transfer mechanism is constructed to directly transfer the substrate between the substrate mounting tables and the carriers mounted in the first and the second loading port.

Position of the imaging unit at which the substrate is imaged, position of the substrate mounting table at which the substrate is transferred and position of the probe card in the first inspection unit are symmetrical with those in the second inspection unit with respect to the horizontal line, respectively.

Preferably, in each of the first and the second inspection unit, the position of the imaging unit at which the substrate is imaged and the position of the probe card are arranged in accordance with the arrangement of the first and the second loading port or arranged in perpendicular to the arrangement of the first and the second loading port.

The position of the substrate mounting table at which the substrate may be transferred is closer to the horizontal line, compared to the position of the imaging unit at which the substrate is imaged and the position of the probe card.

Preferably, the substrate transfer mechanism has three substrate supporting members, each being independently movable back and forth, and receives two substrates to be inspected from the carriers and sequentially transfers the two substrates to the substrate mounting tables of the first and the second inspection unit.

The substrate transfer mechanism may have a vertically movable rotation stage for supporting and rotating a to-be-inspected substrate loaded from the carrier; and a detection unit for detecting a circumference of the substrate rotating by the rotation stage. The rotation stage preferably rotates the substrate to set it in a predetermined orientation based on the detection result of the detection unit.

The substrate imaging device may have at least one low magnification camera for imaging a wide area of the substrate surface and a plurality of high magnification cameras for imaging a narrow area of the substrate surface. The high magnification cameras are preferably arranged at least at three locations. The electrode pads of the chips of the substrate may be made to contact with the probes of the probe card at a time, or be split into four regions to be sequentially brought into contact with the probes.

The substrate mounting table may have a probe imaging device having an upward view. The probe imaging unit is provided with a low magnification camera for imaging a wide area of the probe card and a plurality of high magnification cameras for imaging a narrow area of the probe card.

Preferably, the substrate mounting table may have a probe imaging device having an upward view. The probe imaging unit is provided with a first and a second imaging unit, each having a low magnification camera for imaging a wide area of the probe card and a plurality of high magnification cameras for imaging a narrow area of the probe card.

Preferably, the substrate mounting table has a probe imaging device having an upward view, and wherein a center of a movement region of the substrate mounting table when the substrate is imaged by the substrate imaging device coincides with or is positioned near a center of a movement region of the substrate mounting table when the probe is imaged by the probe imaging device.

To the opposite side of the loader unit against the probe apparatus main body, another probe apparatus main body having a same configuration of the probe apparatus main body may be connected, the probe apparatus main bodies being symmetrical with respect to the rotation center of the substrate transfer mechanism.

The probe apparatus may further includes a unit for selecting, when a substrate unloaded from one of the two carriers is mounted on one of the arms of the substrate transfer mechanism, a function of unloading a substrate from the other carrier by using another arm before the substrate is loaded into the inspection unit.

Two probe apparatuses described above may form a probe system. At this time, the probe apparatuses are arranged symmetrically with each other while the probe apparatus main bodies thereof are disposed adjacent to each other.

The imaging unit including a substrate imaging device having a downward view may have two high magnification cameras and two low magnification cameras. Preferably, the two low magnification cameras are arranged to be symmetrical with respect to a straight line connecting points spaced apart at a same distance from the two high magnification cameras.

The present invention includes: the first and the second loading port which mount thereon two carriers so that the transfer openings thereof face each other; the substrate transfer mechanism having a rotation center between the first and the second loading port; and the first and the second inspection unit being symmetrical to each other and disposed in accordance with the arrangement of the loading ports. In this configuration, the substrates are directly transferred between the carriers and the substrate mounting table of the first or the second inspection unit by the substrate transfer mechanism, so that the apparatus can be miniaturized and, also, the wafer transfer efficiency increases. In addition, since the substrates can be simultaneously inspected by the first and the second inspection unit, the wafer inspection efficiency increases. As a result, a high throughput can be achieved.

BRIEF DESCRIPTION OF THE DRAWINGS

The above and other objects and features of the present invention will become apparent from the following description of embodiments, given in conjunction with the accompanying drawings, in which:

FIG. 12 is a side view of the probe card which depicts an example of the replacement mechanism of the probe card;

FIG. 13 is a side view of a probe card which describes an example of a conventional probe card replacement mechanism;

FIG. 29 sets forth a top view depicting a movement stroke of a micro camera in the first embodiment;

FIG. 30 illustrates a top view of a movement stroke of a micro camera in another example;

FIG. 33 explains a sequence of transferring a wafer by using a wafer transfer mechanism in accordance with the embodiment of the present invention;

FIG. 34 explains a sequence of transferring a wafer by using the wafer transfer mechanism in accordance with the embodiment of the present invention;

FIG. 35 explains a sequence of transferring a wafer by using a wafer transfer mechanism having two arms;

DETAILED DESCRIPTION OF THE EMBODIMENT

Hereinafter, embodiments of the present invention will be described with reference to the accompanying drawings which forms a part hereof. However, the present invention is not limited thereto.

First Embodiment

Figure 1:
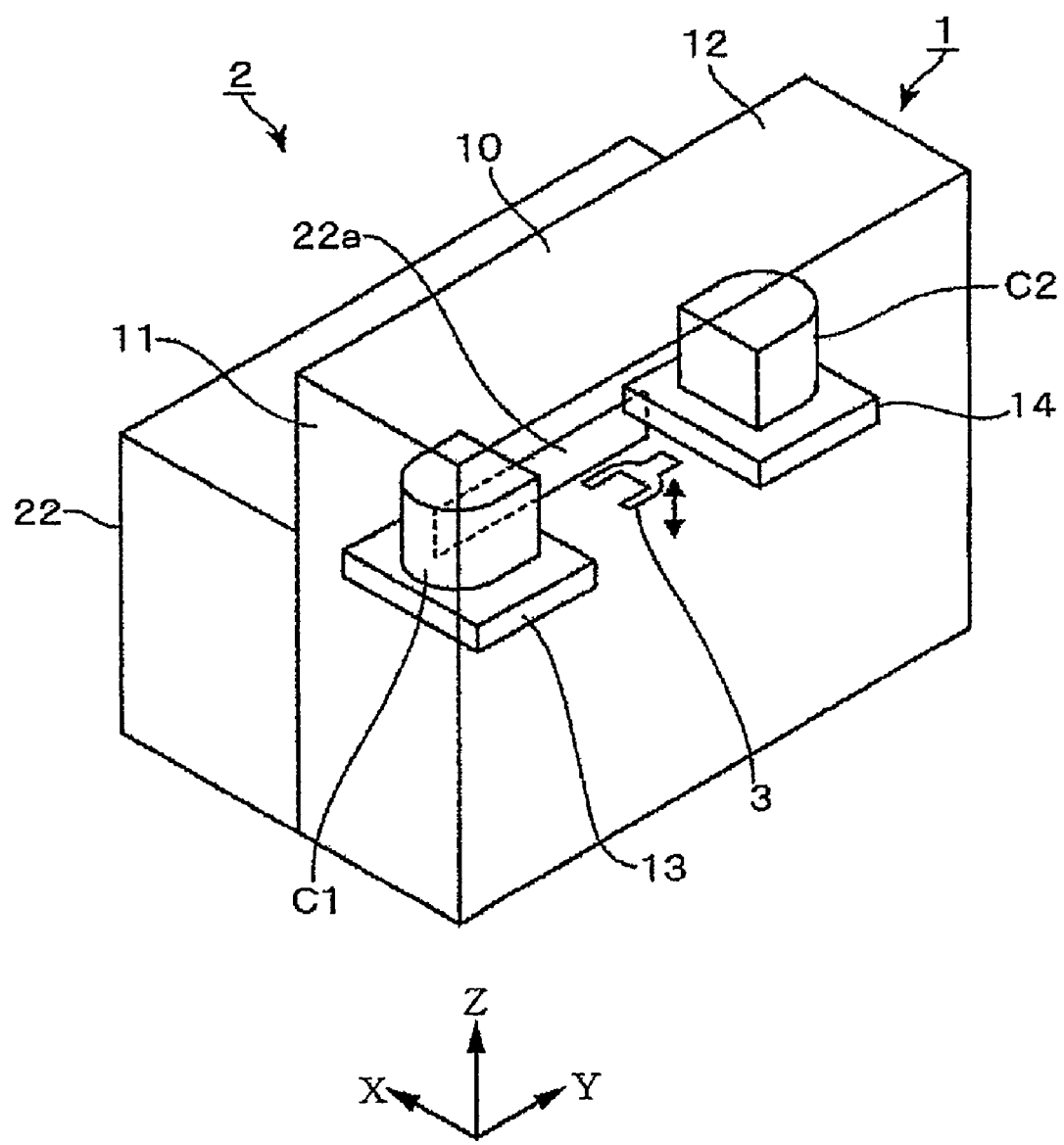
FIG. 1 is a general perspective view of an example of a probe apparatus in accordance with a first embodiment of the present invention.
Figure 2:
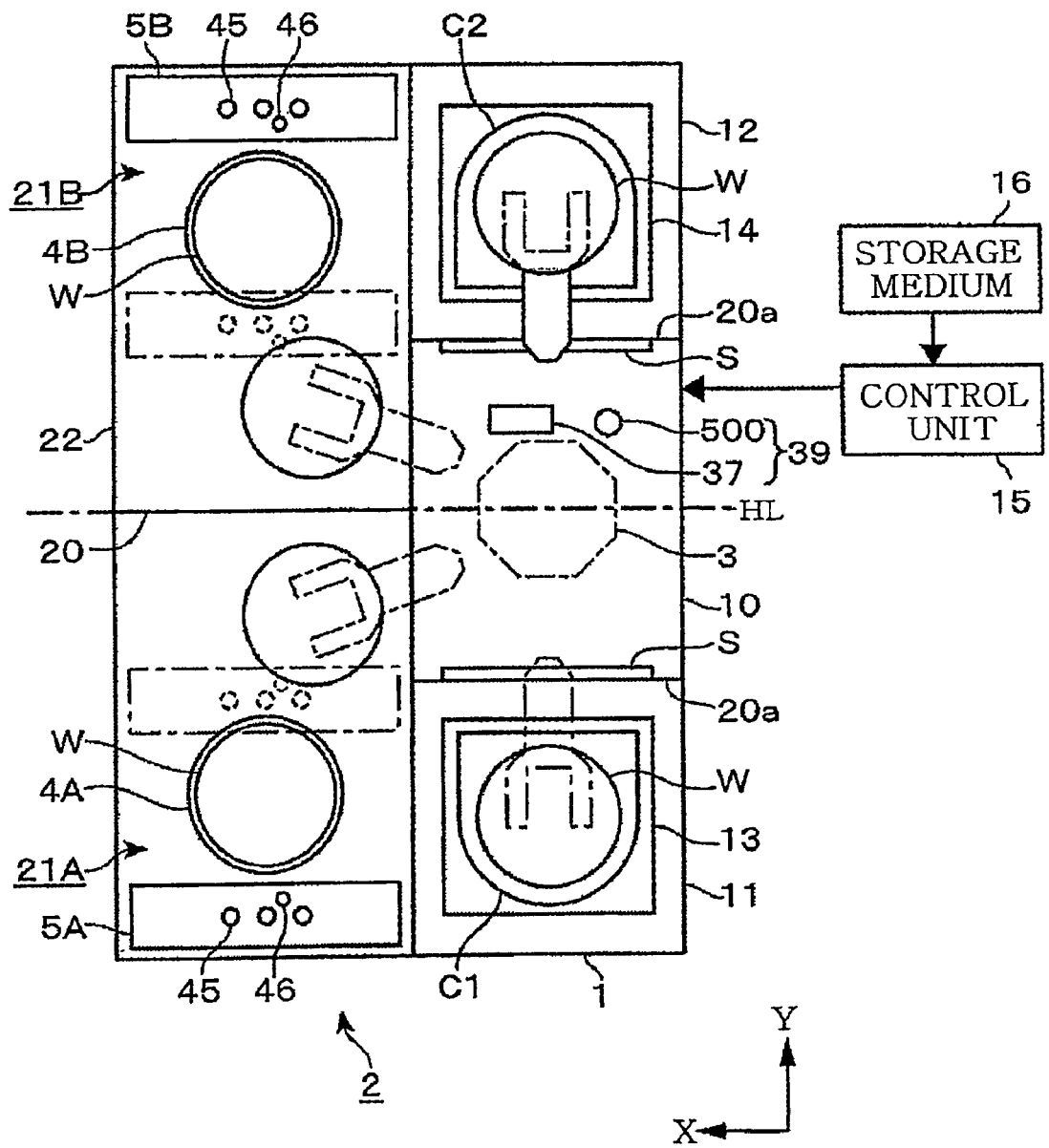
FIG. 2 describes a schematic top view of the example of the probe apparatus.
Figure 3:
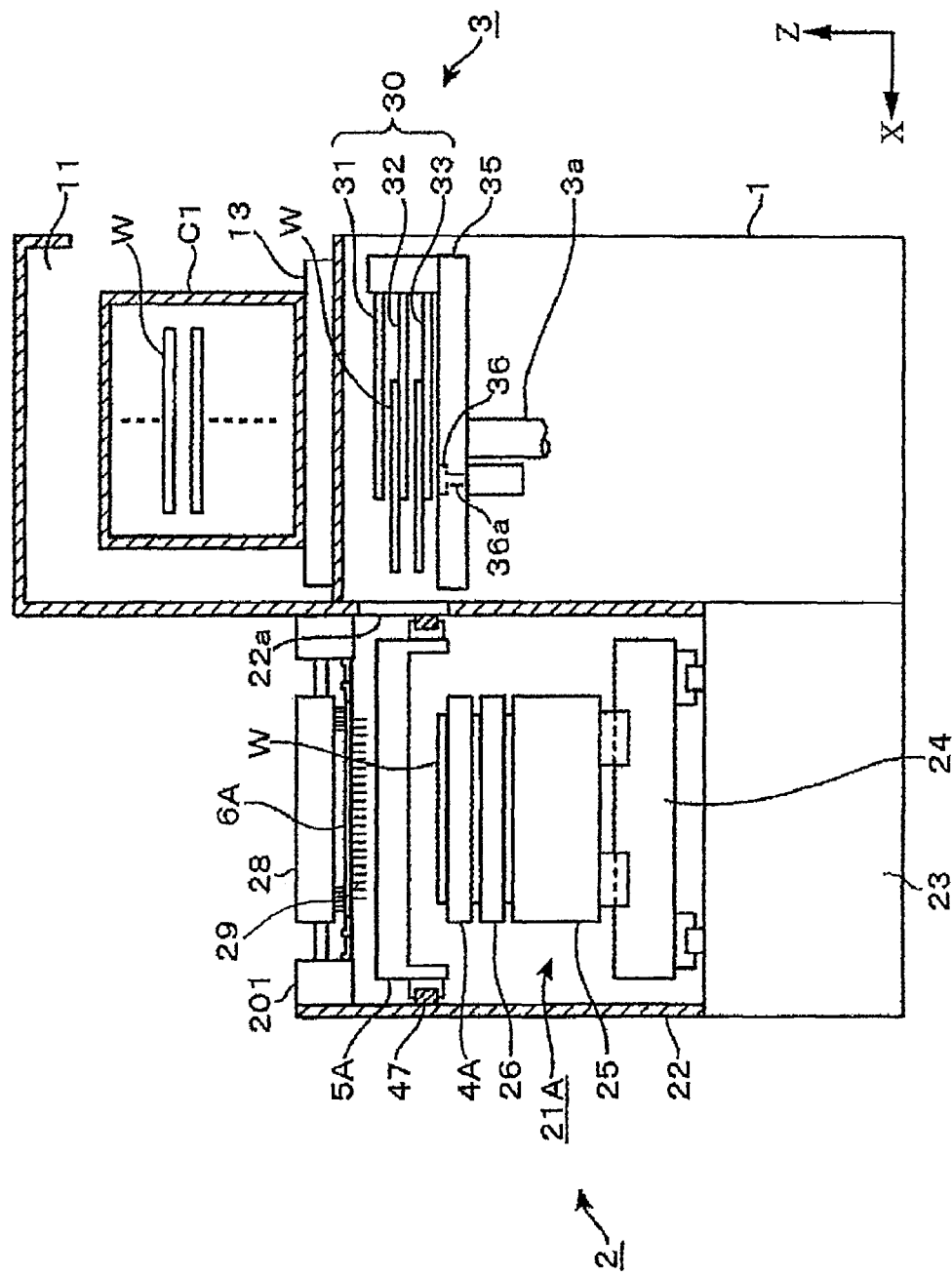
FIG. 3 provides a vertical cross sectional view of the example of the probe apparatus.

As illustrated in FIGS. 1 to 3, a probe apparatus in accordance with a first embodiment of the present invention includes: a loader unit 1 for transferring a wafer W as a substrate having thereon a plurality of chips to be inspected; and a probe apparatus main body 2 for probing the wafer W. Above all, entire layout of the loader unit 1 and the probe apparatus main body 2 will be described briefly.

The loader unit 1 has a first and a second loading port 11 and 12 for loading a first and a second carrier C1 and C2 as transfer containers accommodating therein a plurality of wafers W and a transfer chamber 10 provided between the first and the second loading port 11 and 12. The first and the second loading port 11 and 12 have a first and a second mounting table 13 and 14 spaced from each other in a Y direction, and the first and the second mounting table 13 and 14 mount thereon the carriers C1 and C2 so that transfer openings (front openings) thereof can face each other. Further, the transfer chamber 10 is provided with a wafer transfer mechanism (substrate transfer mechanism) 3 which transfers the wafer W by using an arm 30 as a substrate supporting member.

The probe apparatus main body 2 has a housing 22 forming a casing of the probe apparatus main body 2. The housing 22 is provided near the loader unit 1 in an X direction, and is divided into two sections in the Y direction via a partition wall 20. The two sections correspond to casings of a first and a second inspection unit 21A and 21B. The first inspection unit 21A has a wafer chuck 4A as a substrate mounting table, an alignment bridge 5A serving as an imaging unit having a camera moving in the Y direction above the wafer chuck 4A, and a probe card 6A provided in a head plate 201 forming a ceiling portion of the housing 22. The second inspection unit 21B has the same configuration which includes a wafer chuck 4B, an alignment bridge 5B and a probe card 6B.

Figure 4:
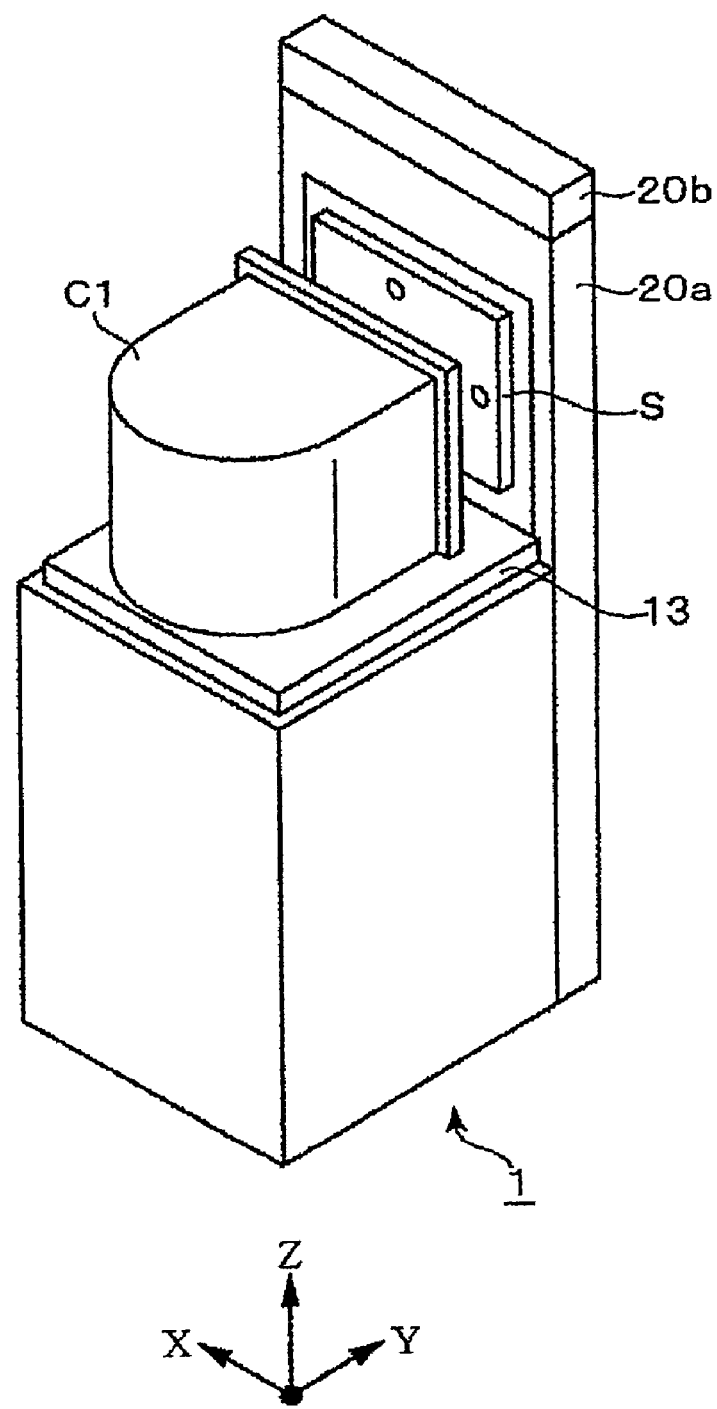
FIG. 4 presents a perspective view of an example of a loading port in the probe apparatus.

Hereinafter, the loader unit 1 will be described. Since the first and the second loading port 11 and 12 are symmetrically arranged and have a same configuration, the configuration of the first loading port 11 is representatively described in FIG. 4. As shown in FIGS. 3 and 4, the loader unit 1 is partitioned from the transfer chamber 10 by a partition wall 20a, and the partition wall 20a is provided with a shutter S and an opening/closing mechanism 20b for opening and closing the shutter S and the transfer opening of the first carrier C1. Moreover, the first mounting table 13 is configured to rotate by an interval of 90° in a clockwise direction and a counterclockwise direction by a rotation mechanism (not shown) positioned therebelow.

Namely, when the airtight carrier C1 called a FOUP (Front Opening Unified Pod) is mounted on the first mounting table 13 from the front side of the probe apparatus (right side of the X direction) by an automatic guided vehicle (AGV) (not shown) in a clean room in a state where the front opening of the carrier C1 faces the probe apparatus (left side of the X direction), the first mounting table 13 rotates by an angle of 90° in the clockwise direction so that the opening can face the shutter S. Meanwhile, when the first carrier C1 is unloaded from the first mounting table 13, the first carrier C1 rotates by an angle of 90° in the counterclockwise direction. The wafer W is transferred between the first carrier C1 and the wafer transfer mechanism 3 by moving back and forth the wafer transfer mechanism 3 with respect to the first carrier C1. At this time, the first carrier C1 communicates with the transfer chamber 1 by opening the shutter S and the transfer opening of the first carrier C1 with the use of the opening/closing mechanism 20b in a state where the opening of the first carrier C1 faces the shutter S.

The wafer transfer mechanism 3 includes a transfer base 35, a rotation axis 3a for rotating the transfer base 35 about a vertical axis, and a lift mechanism (not shown) for vertically moving the rotation axis 3a. The transfer base 35 has three arms 30, and each of the arms 30 independently moves back and forth to transfer the wafer W. The rotation center of the rotation axis 3a is positioned between the first and the second carrier C1 and C2. That is, the rotation center is spaced apart at the same distance from the first and the second carrier C1 and C2. Further, the wafer transfer mechanism 3 can move vertically between an upper position where the wafer W is transferred between the first and the second carrier C1 and C2 and a lower position where the wafer W is transferred between the first and the second inspection unit 21A and 21B.

Figure 5A:
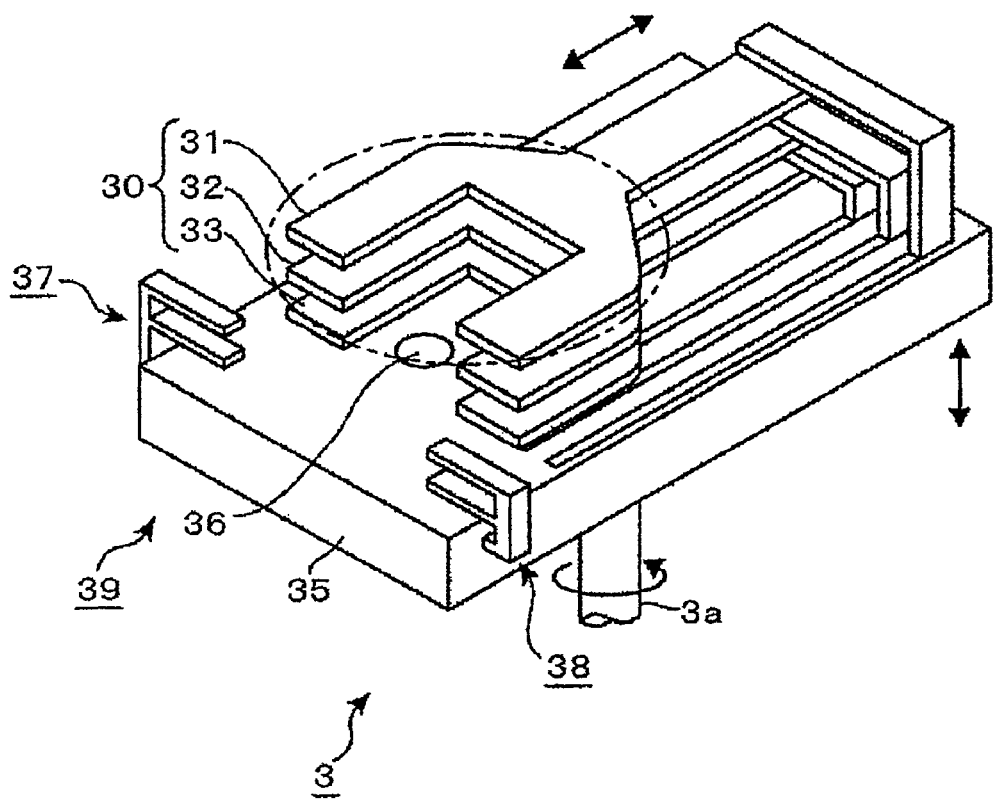
FIGS. 5A and 5B show schematic views of an example of a wafer transfer mechanism in the probe apparatus.
Figure 5B:
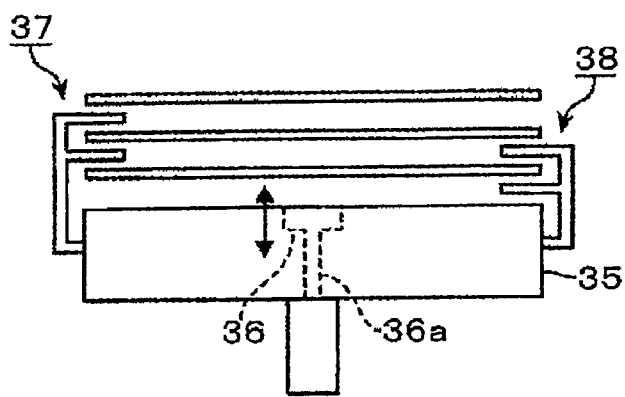

Moreover, referring to FIGS. 5A and 5B, the wafer transfer mechanism 3 includes a pre-alignment mechanism 39 for pre-aligning the wafer W. The pre-alignment mechanism 39 has an axis 36a that freely rotates and vertically moves up and down through the transfer base 35 and a chuck portion 36 provided on top of the axis 36a and serving as a rotation stage.

Under normal circumstances, the chuck portion 36 is engaged into a recess formed in the surface of the transfer base 35 to form a same plane with the surface of the transfer base 35. The chuck portion 36 is located at a position corresponding to a central position of a wafer on one of the arms 30, which are moved back to a middle of a movement route, and serves to lift the wafer W slightly off the arm and rotate it.

The pre-alignment mechanism 39 includes optical sensors 37 and 38 which serve together as a detection unit having a light emitting sensor and a light receiving sensor for detecting a circumference of the wafer W rotated by the chuck portion 36. The optical sensors 37 and 38 are fixed to the transfer base 35 while being deviated from the movement region of the arms 30. In this example, the wafers W on a lower and a middle arm 33 and 32 will be pre-aligned, so that the heights of the optical sensors 37 are set to avoid the contact with the circumference of the wafers W during an access to the wafers W while the edge portions thereof are positioned upper and lower portions of the circumstances of the wafers W. Although it is not shown, the loader unit 1 further includes a controller for detecting a central position of the wafer W and a direction reference such as notches or orientation flats of the wafer W based on signals from the optical sensors 37 and 38 and then rotating the chuck portion 36 based on the detection result so that the notches or the like can face a predetermined direction.

The following is a brief description of a process for adjusting (pre-aligning) a direction of the wafer W mounted on the lower arm 33 by the pre-alignment mechanism 39 including the optical sensors 37 and 38 and the chuck portion 36. First of all, the wafer W on the lower arm 33 is slightly lifted and rotated by the chuck portion 36 and, at the same time, light is emitted from a light emitting portion of the optical sensor 38 toward a light receiving portion via an area including a circumferential portion (edge portion) of the wafer W. Next, the chuck portion 36 stops in a state where the wafer W is positioned in a predetermined direction on the lower arm 33. Then, the chuck portion 36 is lowered, and the wafer W is transferred on the lower arm 33. As a consequence, the direction of the wafer W is adjusted.

Thereafter, when the wafer W is mounted on the wafer chuck 4A of the first inspection unit 21A, the position of the wafer transfer mechanism 3 is adjusted to correct the eccentricity of the wafer W. As a result, the direction and the eccentricity of the wafer W are adjusted. The optical sensors 37 and 38 are not illustrated in FIG. 3.

Figure 6:
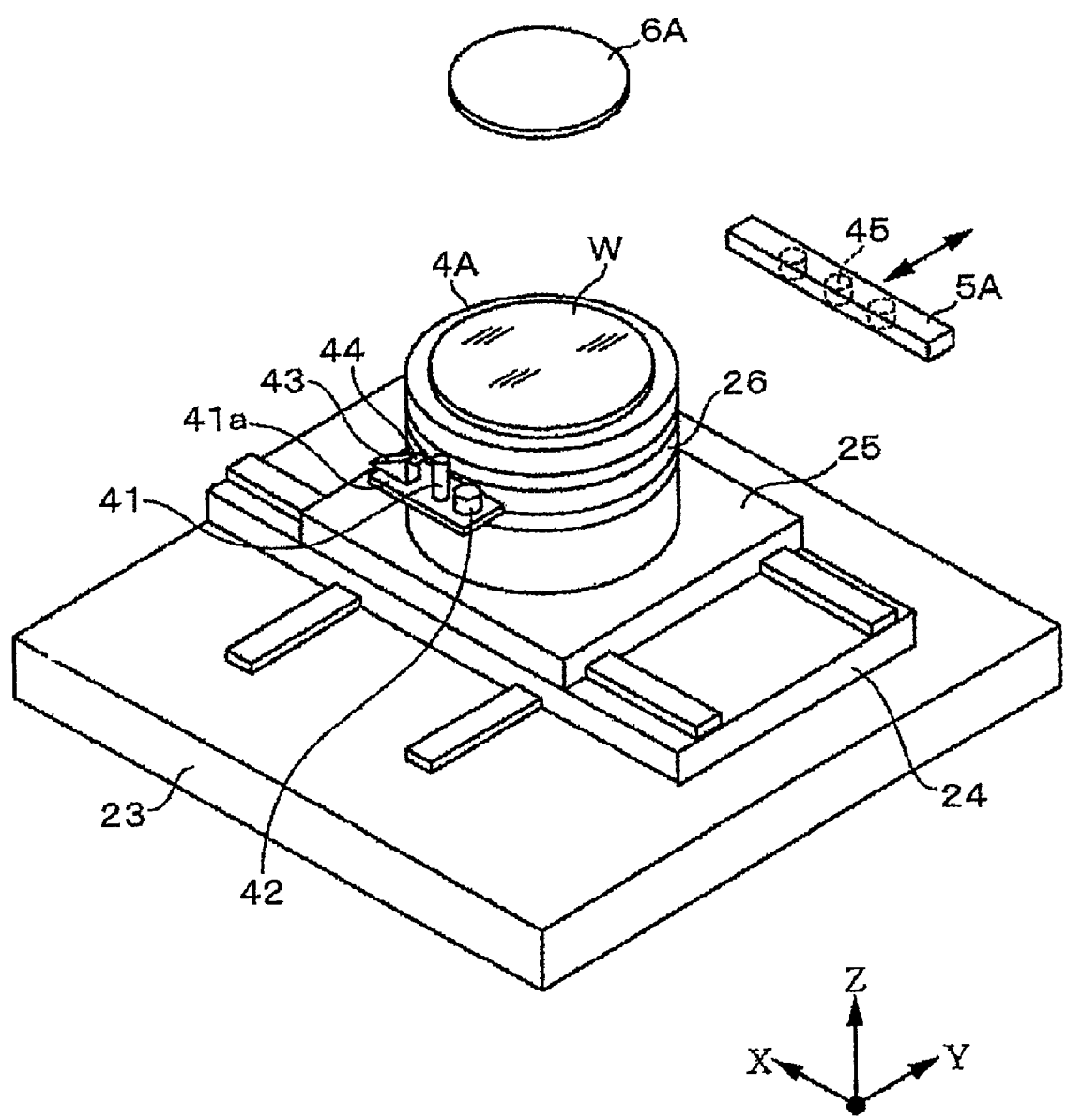
FIG. 6 offers a perspective view of an example of an inspection unit in the probe apparatus.

Hereinafter, the probe apparatus main body 2 will be described. In the housing 22 of the probe apparatus main body 2, a strip-shaped transfer opening 22a extending in a horizontal direction (Y direction) opens in a sidewall of the loader unit 1 side, to thereby transfer the wafer W from/to the first inspection unit 21A or the second inspection unit 21B. In the first and the second inspection unit 21A and 21B, the positions for transferring wafers W, the positions for imaging surfaces of the wafers W and the positions for installing the respective probe cards 6A and 6B are symmetrical with respect to a horizontal line HL perpendicular to a straight line connecting the first and the second loading port 11 and 12 via the rotation center of the wafer transfer mechanism 3. Further, since the first and the second inspection unit 21A and 21B have a same configuration, the first inspection unit 21A will be representatively described with reference to FIGS. 3, 6 and 7.

The inspection unit 21A has a base 23. Further, a Y stage 24 and an X stage 25 are provided on the base 23 in that order. The Y stage 24 is driven in the Y direction by, e.g., a ball screw or the like, along a guide rail extending in the Y direction, and the X stage 25 is driven in the X direction by, e.g., a ball screw, along a guide rail extending in the X direction. Although it is not shown, the X stage 25 and the Y stage 24 have motors combined with encoders.

Provided on the X stage 25 is a Z moving unit 26 moving in a Z direction by a motor combined with an encoder (not shown). The Z moving unit 26 has a wafer chuck 4A serving as a substrate mounting table capable of rotating about a Z-axis (moving in a θ direction), so that the wafer chuck 4A can move in X, Y, Z and θ directions. A driving unit is formed by the X stage 25, the Y stage 24 and the Z moving unit 26, and is constructed to move the wafer chuck 4A among the transfer positions for transferring the wafer W with respect to the wafer transfer mechanism 3, the imaging positions on the surface of the wafer W and the contact positions (inspection positions) of the probe needles 29 of the probe card 6A, as will be described later.

The probe card 6A is detachably adhered to the head plate 201 above the movement region of the wafer chuck 4A. The adhesion structure or the replacement method of the probe card 6A will be described later. The probe card 6A has on a top surface thereof an electrode group. Further, a pogo pin unit 28 having on a bottom surface thereof a plurality of pogo pins 28a as an electrode unit positioned corresponding to the electrode group of the probe card 6A is provided above the probe card 6A to electrically connect the electrode group and the test head (not shown). Generally, the test head (not shown) is positioned on the top surface of the pogo pin unit 28. In this example, however, the test head is separately provided from the probe apparatus main body 2, and is connected with the pogo pin unit 28 via a cable (not illustrated).

The probes are provided on the entire bottom surface of the probe card 6A. The probes, i.e., vertical needles (wire probe needles) are electrically connected with the electrode group of the top surface of the probe card 6A and extend vertically with respect to the surface of the wafer W to correspond to the arrangement of the electrode pads of the wafer W. As for the probes, there may be used the probe needles 29 made of a metal wire extending downward slantingly with respect to the surface of the wafer W, a gold bump electrode formed on a flexible film or the like. The probe card 6A in this example is configured to make a contact with all the electrode pads of the chips to be inspected (IC chips) on the wafer surface at a time, so that the electrical characteristics can be measured by a single contact operation.

A micro camera 41 having an upward view, i.e., a first imaging unit for imaging the probe needles 29, is fixed via a fixing plate 41a to a side portion of the Z moving unit 26, the side portion facing toward the partition wall 20 of the wafer chuck 4A. The micro camera 41 is formed as a high magnification camera having a CCD camera so that an enlarged view of a needle tip of a probe needle 29 or an alignment mark of the probe card 6A can be obtained. Moreover, the micro camera 41 is positioned substantially at the center point in the X direction of the wafer chuck 4A. In order to check the arrangement and the positions of the probe needles 29 during the alignment, the micro camera 41 images specific probe needles 29, e.g., the probe needles 29 positioned at both ends of the X and Y directions. Further, in order to monitor the states of the probe needles 29 regularly, the micro camera 41 images all the probe needles 29 sequentially.

Figure 7A:
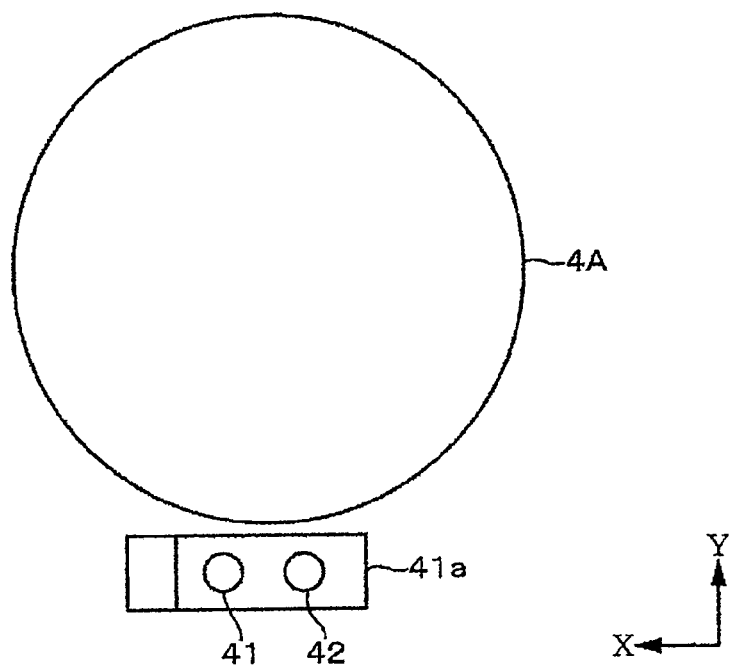
FIGS. 7A and 7B show schematic views of the example of the inspection unit.
Figure 7B:
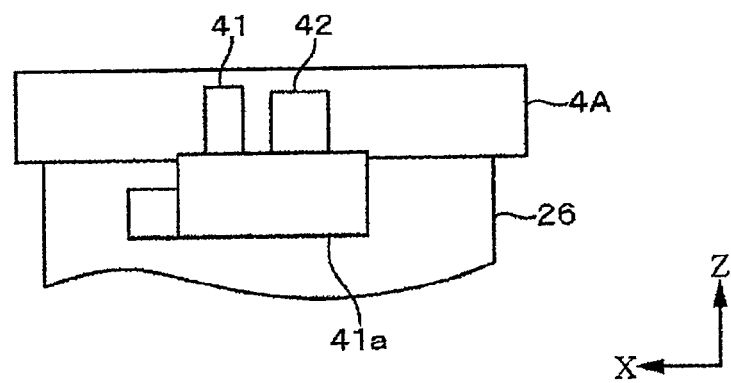

A micro camera 42 as a low magnification camera for imaging the arrangement of the probe needles 29 in a wide area is fixed to the fixing plate 41a near the micro camera 41. In addition, a target 44 is provided on the fixing plate 41a so that it can move back and forth by a reciprocating mechanism 43 in a direction perpendicular to an optical axis with respect to an in-focus surface of the micro camera 41. The target 44 can be recognized through an image by the micro camera 41 and a micro camera 45 to be described later. Moreover, the target 44 has a structure that a circular metallic film as a subject for alignment, e.g., a metallic film having a diameter of about 140 micron, is deposited on, e.g., a transparent glass plate. FIGS. 7A and 7B provide a top view and a side view schematically describing a positional relationship between the wafer chuck 4A and the micro cameras 41 and 42. The target 44 or the reciprocating mechanism 43 is omitted in FIGS. 7A and 7B.

Figure 8:
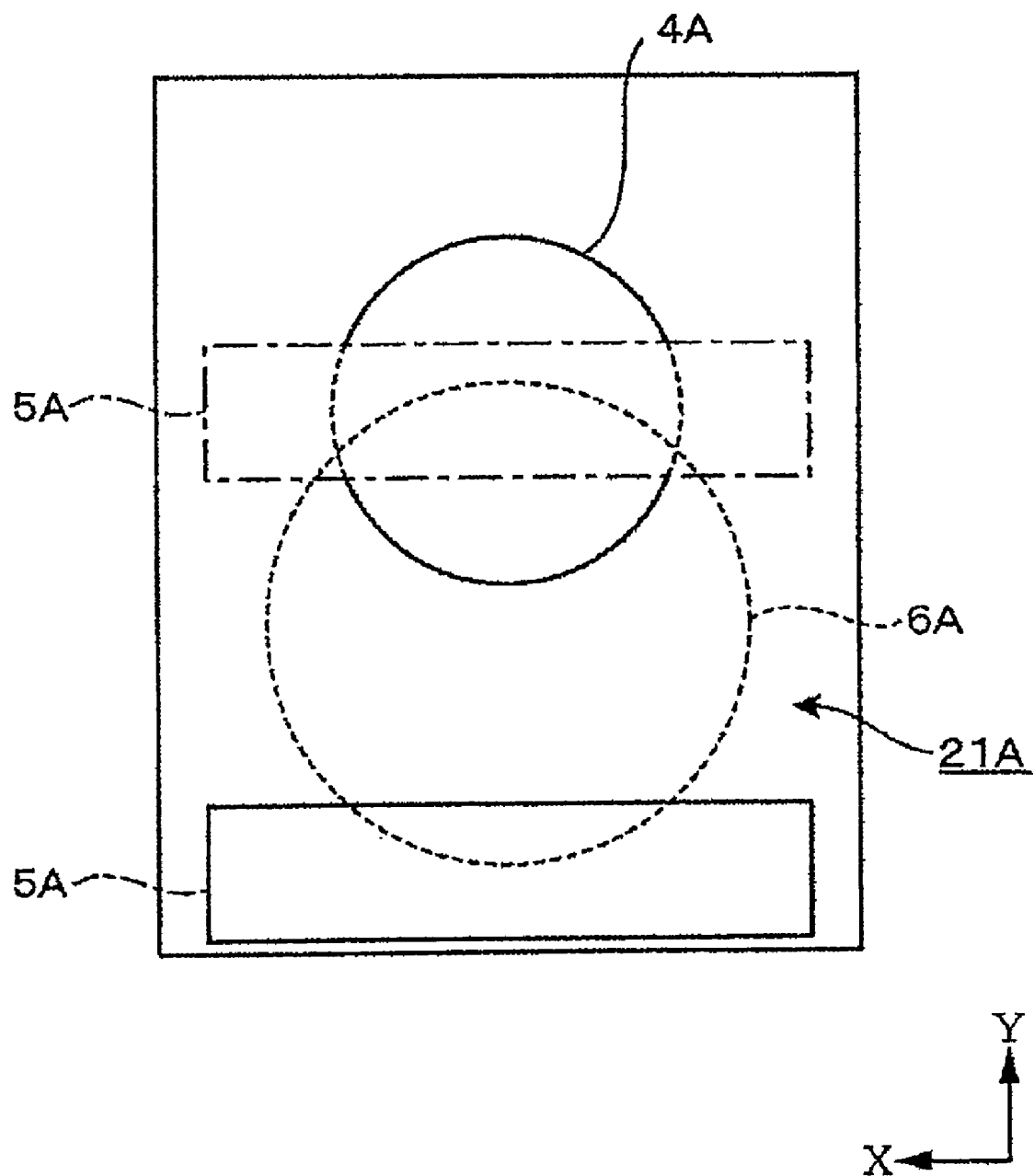
FIG. 8 illustrates a position of an alignment bridge in the inspection unit.

Guide rails 47 are provided along the Y direction on both sides (front side and inner side) in the X direction of an inner wall surface of the housing 22 between the wafer chuck 4A and the probe card 6A. As illustrated in FIG. 8, the alignment bridge 5A as an imaging unit can move in the Y direction along the guide rail 47 between a reference position to be described later and the imaging position.

The alignment bridge 5A has a plurality of, e.g., three, micro cameras 45 having a downward view. The three micro cameras 45 serve together as a second imaging unit for imaging a substrate, and are spaced from each other at regular intervals along the X direction. The central micro camera 45 among the three micro cameras 45 is positioned at a central portion of the movement region of the wafer chuck 4A. The other micro cameras 45 positioned at both ends are spaced from the central micro camera 45 at a distance equal to that between the center of the wafer chuck 4A and an outermost chip to be inspected of the wafer W or at a distance corresponding to ⅓ of the diameter of the wafer W. These micro cameras 45 are high magnification cameras including a CCD camera so that the enlarged view of the surface of the wafer W can be obtained. Moreover, the alignment bridge 5A has a low magnification camera 46 provided at the Y-axis direction side of the micro cameras 45. The low magnification camera 46 is illustrated only in FIG. 2.

A reference position corresponding to the stop position of the alignment bridge 5A is a position at which the alignment bridge 5A retreats to avoid the contact with the wafer chuck 4A or the wafer transfer mechanism 3 when the wafer W is transferred between the wafer chuck 4A and the wafer transfer mechanism 3, when the wafer W is brought into contact with the probe card 6A and when the probe needles 29 are imaged by the first imaging unit (micro camera 41). Moreover, the imaging position is a position obtained when the surface of the wafer W is imaged by the low magnification camera 46 and the micro cameras 45 of the alignment bridge 5A. The surface of the wafer W is imaged by the micro cameras 45 and the low magnification camera 46 while moving the wafer chuck 4A in a state where the alignment bridge 5A is fixed to the imaging position.

Figure 9:
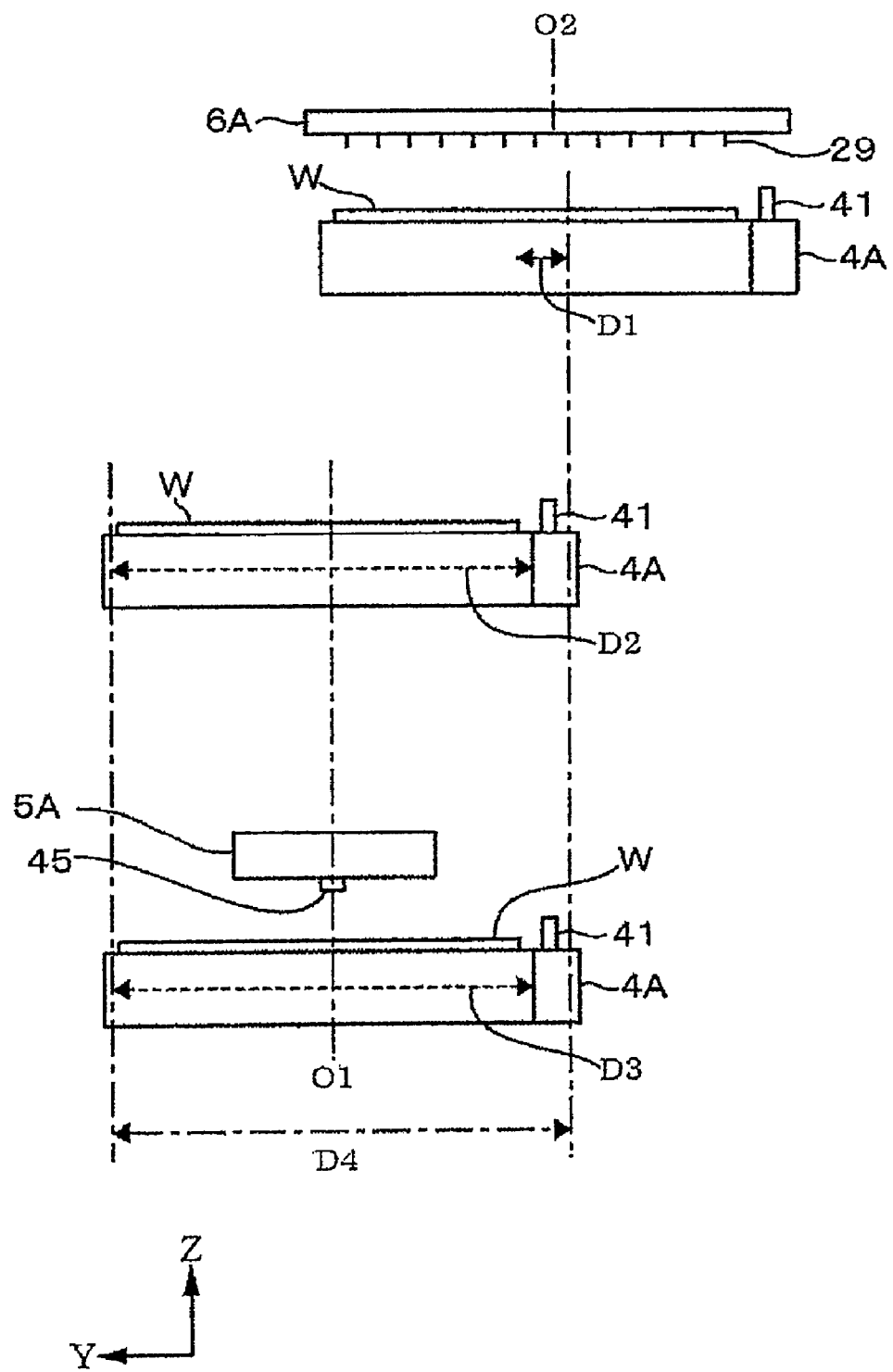
FIG. 9 depicts a schematic view of an example of a movement stroke of a wafer chuck in the inspection unit.

As can be seen from FIG. 8 and a lower portion of FIG. 9, the imaging position is deviated toward an inner side of the Y direction (toward the center of the probe apparatus main body 2) with respect to the central position of the probe card 6A. The reason thereof will be described as follows.

As set forth above, when the probe needles 29 are imaged by the micro camera 41 provided on a side surface of the wafer chuck 4A (front side of the Y-axis direction), a movement stroke D2 in the Y-axis direction of the wafer chuck 4A (a movement stroke of a central position O1 of the wafer chuck 4A) is deviated toward the partition wall 20 side of the Y-axis direction with respect to a central position O2 of the probe card 6A, as shown in a middle portion of FIG. 9. Meanwhile, as illustrated in an upper diagram of FIG. 9, a movement stroke D1 of the wafer chuck 4A at which the wafer W contacts with the probe needles 29 is short, because a plurality of probe needles 29 is formed on the bottom surface of the probe card 6A, so that the probe needles 29 are brought into contact with the wafer W at a time. Accordingly, when the imaging position of the alignment bridge 5A is aligned with the central position O2 of the probe card 6A, a movement stroke D3 of the wafer chuck 4A at which the surface of the wafer W is imaged by the micro camera 45 is deviated toward the right side of the movement stroke D1.

Therefore, the imaging position of the alignment bridge 5A is made to be biased toward the partition wall 20 side of the Y-axis direction so that the movement strokes D2 and D3 are overlapped with each other, thereby shortening a driving stroke (movable range) D4 including the movement strokes D1 to D3 of the wafer chuck 4A, i.e., a distance in the Y-axis direction of the probe apparatus main body 2. The movement strokes D2 and D3 may not be the same as long as the imaging position of the alignment bridge 5A is deviated toward the partition wall 20 side of the Y-axis direction with respect to the central position O2 of the probe card 6A.

Hereinafter, peripheral units of the pogo pin unit 28 and the mechanism for replacing the probe card 6A will be described with reference to FIGS. 10 to 12.

The head plate 201 has a pair of guide rails 80 extending in the Y direction and guiding the probe card 6A between the inspection position (directly under the pogo pin unit 28) for inspecting the wafer W and the replacement position located outside the housing 22 (the side of the opposite side where the partition wall 20 is positioned). Engaged to the guide rails 80 are end portions of trays 82 configured to move in the Y direction along the guide rails 80 together with card holders 81 fixed on the trays 82. Moreover, the probe card 6A is clamped to the card holders 81, and the trays 82 are provided with attaching/detaching mechanisms (not shown) for attaching and detaching the probe card 6A and the card holders 81 by rotating the probe card 6A and the card holders 81 in predetermined directions with respect to the trays 82.

Figure 10:
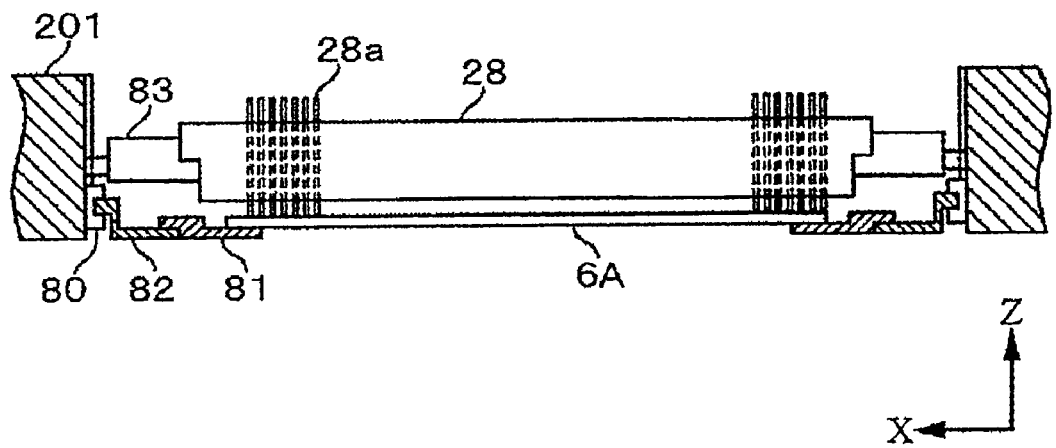
FIG. 10 is a side view of a probe card which indicates an example of a replacement mechanism of the probe card in the inspection unit.
Figure 11:
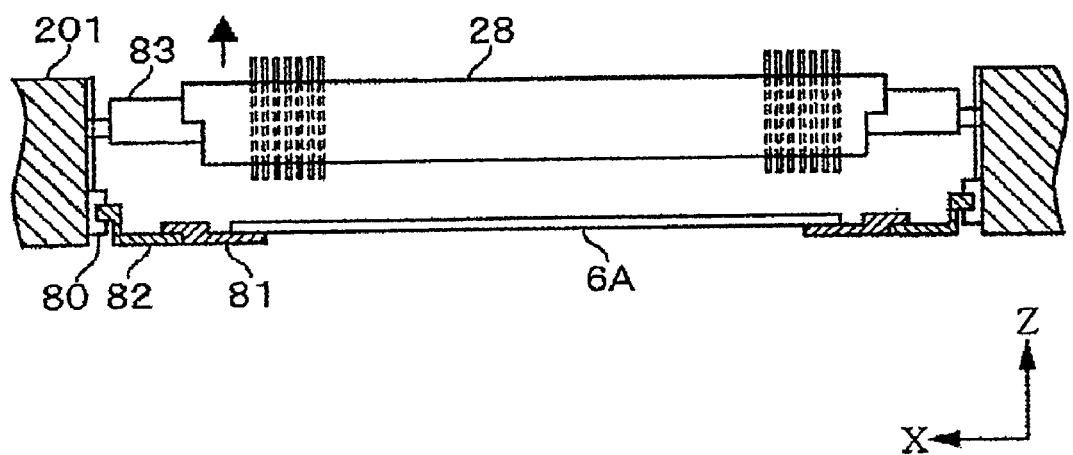
FIG. 11 is the side view of the probe card which shows the example of the replacement mechanism of the probe card.

Meanwhile, the pogo pin unit 28 is configured to move vertically by elevators 83 provided at openings of the head plate 201 between the position of FIG. 10 at which the probe card 6A contacts with the wafer W and the upper position shown in FIG. 11. In order to replace the probe card 6A, after the pogo pin unit 28 is moved up, the trays 82 need to move to the replacement position, as illustrated in FIG. 12. Next, the probe card 6A is separated by rotating the probe card 6A only or the probe card 6A and the card holder 81 in a predetermined direction. Thereafter, a new probe card 6A is mounted on the trays 82, and is positioned in a predetermined direction. Next, the new probe card 6A is guided to the inspection position along the guide rails 80 via the trays 82 in a reverse sequence of the separation sequence and, then, the pogo pin unit 28 is moved down.

When the probe card 6A is replaced, the movement area of the card holder 81 and that of the alignment bridge 5A are vertically separated not to interfere with each other. Further, when the probe card 6A is replaced, the alignment bridge 5A is set to, e.g., a position indicated by a solid line in FIG. 2. Since the alignment bridge 5A and the probe card 6A do not contact with each other, the probe card 6A can be replaced regardless of the position of the alignment bridge 5A. Moreover, the head plate 201 and the replacement mechanism (the guide rails 80 and the like) of the probe card 6A are installed as a unit, so that the maintenance can be carried out by opening the head plate 201. In the same manner, the second inspection unit 21B has a replacement mechanism of the probe card 6B.

The probe card 6A can be replaced by another method other than the above method. To be specific, a transfer table 90a capable of swinging in a horizontal direction is provided between the inspection position and the replacement position, as illustrated in FIG. 13, and the probe card 6A is replaced by lowering the probe card 6A located at the inspection position with the use of a vertically movable replacement member 90 and then unloading the probe card 6A to the replacement position by swinging the transfer table 90a to the outside of the housing 22. In that case, however, it is difficult to perform the maintenance without opening the head plate 201 and unloading the transfer table 90a to the outside. Therefore, it is preferable to use the replacement mechanism described in FIGS. 10 to 12.

As shown in FIG. 2, the probe apparatus includes a control unit 15 which is, e.g., a computer. The control unit 15 has a data processing unit formed of a program, a memory, a CPU or the like. The program has multiple steps for controlling a series of operations of each unit which includes loading of the carrier C into the loading port 11 or 12, inspecting the wafer W, returning the wafer W to the carrier C and unloading the carrier C. Further, the program (including a program for manipulating input or displaying) is stored in a storage medium 16, e.g., a flexible disk, a compact disk, an MO (magneto-optical) disk, a hard disk or the like, and is installed in the control unit 15.

Hereinafter, the operation of the probe apparatus will be described. First of all, the carrier C is loaded from the opposite side of the probe apparatus main body 2 into the loading port 11 or 12 by the AGV in a clean room. At this time, the transfer opening of the carrier C faces the probe apparatus main body 2. However, the transfer opening of the carrier C is made to face the shutter S by rotating the mounting table 13 or 14. Next, the mounting table 13 moves forward, so that the carrier C is pushed toward the shutter S. As a result, the lid of the carrier C and the shutter S are separated.

Thereafter, the wafer W is unloaded from the carrier C, and is transferred to the inspection unit 21A or 21B. Since the two wafers W1 and W2 are already inspected by the first and the second inspection unit 21A and 21B, the process for unloading next wafers W3 and W4 from the carrier C will be described hereinafter.

Figure 14:
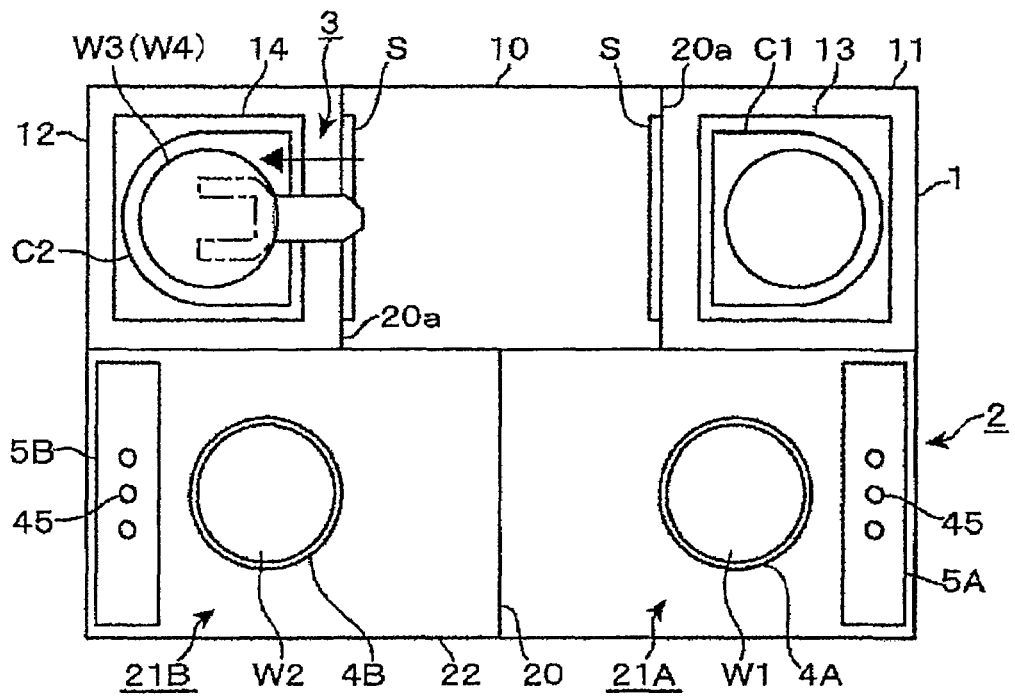
FIG. 14 presents a top view of an exemplary operation of the probe apparatus.
Figure 15:
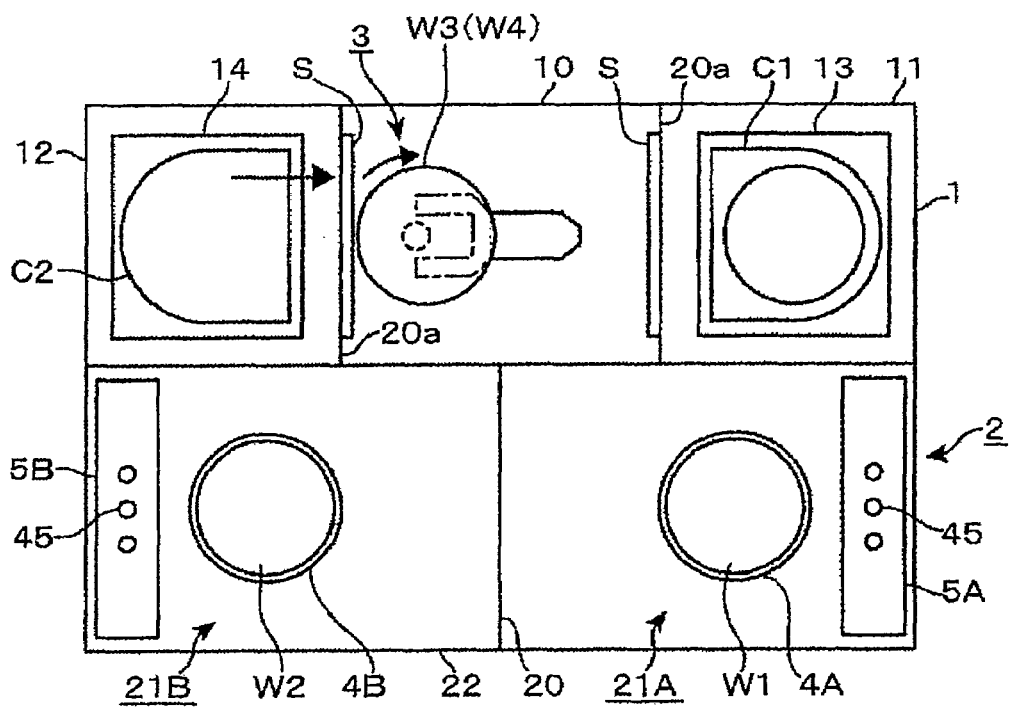
FIG. 15 shows a top view of an exemplary operation of the probe apparatus.

Above all, the middle arm 32 moves into the second carrier C2 to receive the wafer W3, and then is retreated to a position for pre-alignment, as described in FIG. 14. Next, pre-alignment is performed. That is, the chuck portion 36 moves up to raise the wafer W3 and rotate, whereby the notch direction of the wafer W3 is controlled to correspond to the first or second inspection unit where the wafer W3 will be inserted based on the detection result of the optical sensor 37. During the pre-alignment, eccentricity of the wafer W3 is also detected. Then, as shown in FIG. 15, the lower arm 33 moves into the second carrier C2 to receive the wafer W4. In that state, the notch direction of the wafer W4 is controlled to correspond to the first or second inspection unit where the wafer W4 will be inserted and the eccentricity of the wafer W4 is detected. Thereafter, the wafer transfer mechanism 3 is lowered to replace the wafers W3 and W4 with the wafers W1 and W2.

Figure 16:
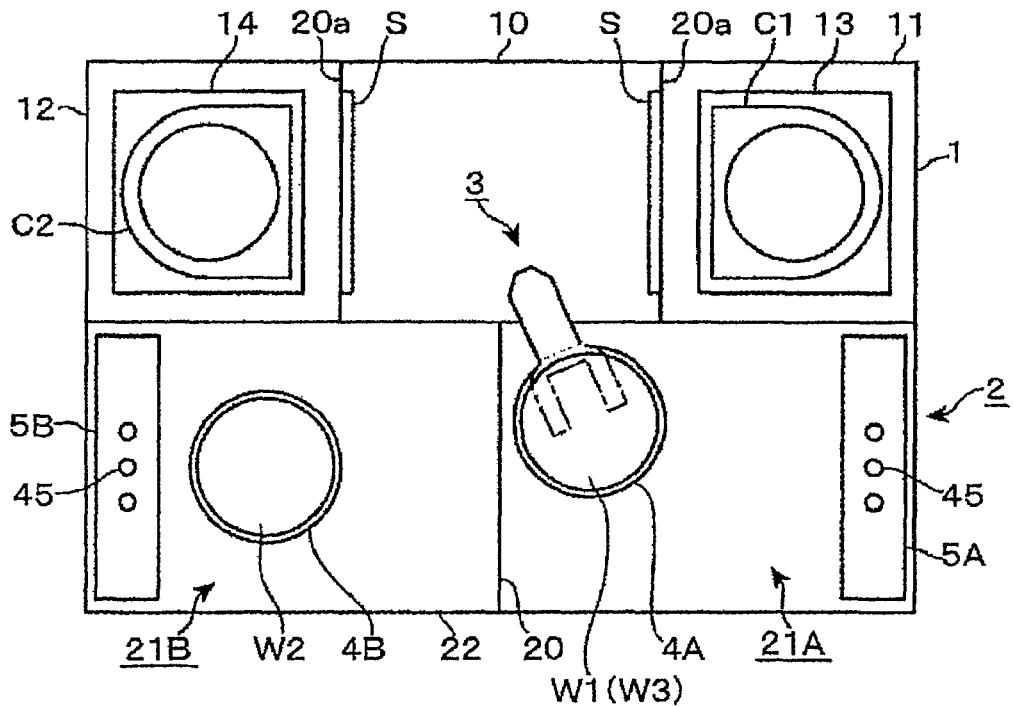
FIG. 16 describes a top view of the exemplary operation of the probe apparatus.

Next, the wafer W1 in the first inspection unit 21A is replaced with the wafer W3 mounted on the wafer transfer mechanism 3. If the inspection of the wafer W1 is completed, the wafer chuck 4A moves to the transfer position near the partition wall 20, as can be seen from FIG. 16. Thereafter, the vacuum chuck of the wafer chuck 4A is released, and the lift pin in the wafer chuck 4A is moved up to raise the wafer W1. When the empty upper arm 31 moves onto the wafer chuck 4A, the lift pin is lowered and, then, the upper arm 31 receives the wafer W1 and retreats. Next, the wafer transfer mechanism 3 is slightly raised, and the middle arm 32 moves onto the wafer chuck 4A. If it is determined that the central position of the wafer W3 is deviated in the pre-alignment, the wafer W3 is mounted on the wafer chuck 4A by the cooperation of the lift pin (not shown) and the middle arm 32 so that the eccentricity of the wafer W3 can be corrected.

Figure 17:
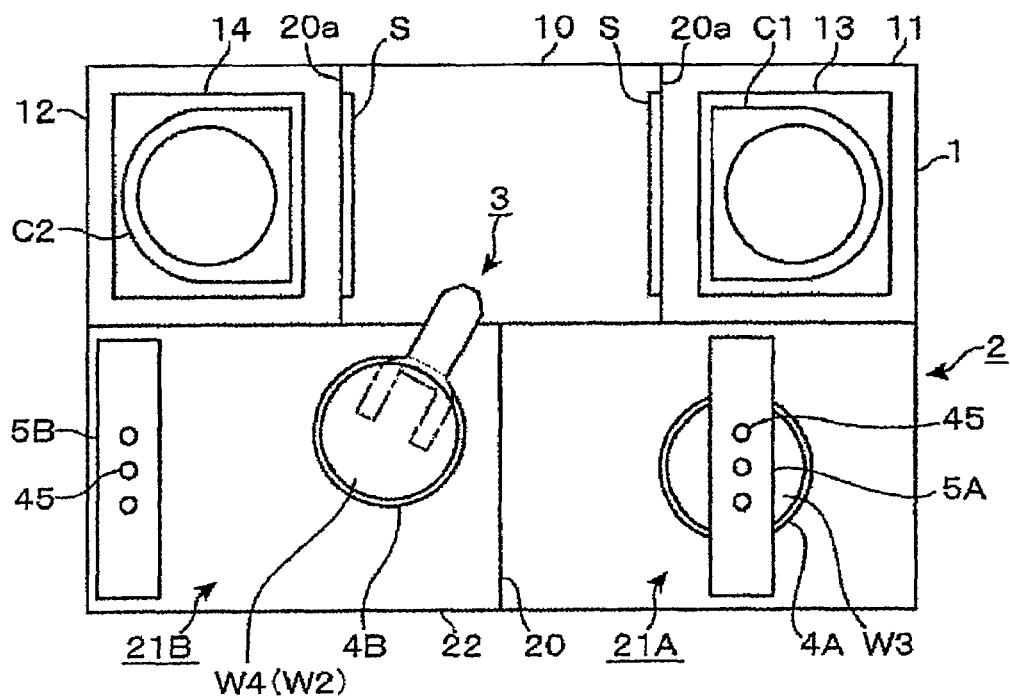
FIG. 17 shows a top view of the exemplary operation of the probe apparatus.

Thereafter, as shown in FIG. 17, the middle arm 32 that has become empty after the wafer W3 is transferred to the first inspection unit 21A moves into the second inspection unit 21B. Next, the middle arm 32 receives the wafer W2 inspected on the wafer chuck 4B and retreats. Thereafter, the lower arm 33 moves onto the wafer chuck 4B, and the wafer W4 to be inspected is transferred from the lower arm 33 to the wafer chuck 4B.

Next, the wafer transfer mechanism 3 is raised, and the wafers W1 and W2 are returned to, e.g., the first carrier C1. Besides, next wafers W5 and W6 are unloaded from the carrier C to be subjected to the same processes.

Meanwhile, in the first inspection unit 21A, after the wafer W3 is transferred to the wafer chuck 4A, the probe needles 29 of the probe card 6A are imaged by the micro camera 41 provided at the wafer chuck 4A. To be specific, the probe needles 29 positioned at both ends of the X direction and those positioned at both ends of the Y direction are imaged, thereby checking the center of the probe card 6A and the arrangement of the probe needles 29. In this case, the needle tip positions of the target probe needles 29 in a region near a target position which is determined by the micro camera 42 are detected by the micro camera 41. At this time, the alignment bridge 5A is retreated to the reference position depicted in FIG. 8.

Next, the alignment bridge 5A moves to the imaging position of the wafer W3 (see FIG. 8) and, at the same time, the target 44 (see FIG. 6) is made to project to an area between the micro camera 41 of the wafer chuck 4A and the micro cameras 45 of the alignment bridge 5A. Thereafter, the position of the wafer chuck 4A is adjusted so that the focuses and the optical axes of the micro cameras 41 and 45 coincide with the target mark of the target 44. As a result, the original point of the micro cameras 41 and 45 is obtained.

Figure 18:
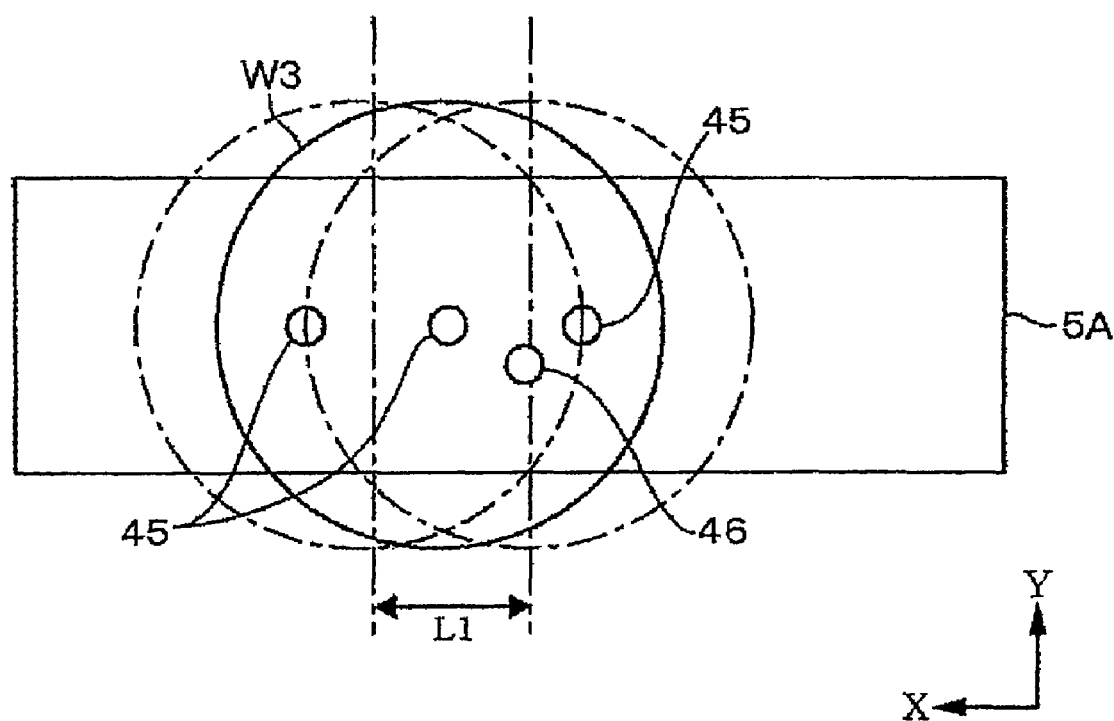
FIG. 18 illustrates a top view of a movement stroke of a wafer chuck which is obtained when specific points on a wafer are imaged by a second imaging unit.

After the target 44 is retreated, the wafer chuck 4A is positioned under the alignment bridge 5A. In that state, the wafer chuck 4A moves so that a plurality of specific points formed on the wafer W3 can be imaged by any one of the three micro cameras 45 of the alignment bridge 5A. In this case, the wafer chuck 4A is guided to a vicinity of a target area on the wafer W, based on the imaging result of the micro camera 46. In this example, the three micro cameras 45 are spaced from each other at the distance corresponding to ⅓ of the diameter of the wafer W3. Therefore, even if the entire surface of the wafer W is sequentially imaged by the micro cameras 45, the movement distance of the wafer W3 in the X direction (the driving amount of the ball screw which is required to move the X stage 25) corresponds to a movement distance L1 of the center of the wafer chuck 4A between a position where the micro camera 45 provided at one end side is overlapped with one end portion of the wafer W3 and a position where the micro camera 45 provided at the other end side is overlapped with the other end portion of the wafer W3 as illustrated in FIG. 18, i.e., a distance corresponding to ⅓ of the diameter of the wafer W3. Accordingly, even if the specific points on the wafer W3 are positioned on the circumference of the wafer W3, the movement distance of the wafer chuck 4A in the X direction decreases.

Based on the position of the wafer chuck 4A at which the imaging is performed and the position of the wafer chuck 4A at which the original position is obtained, the control unit 15 can calculate coordinates of the wafer chuck 4A at which the probe needles 29 of the probe card 6A contact with the electrodes pads on the wafer W3. By moving the wafer chuck 4A to the calculated contact position, the probe needles 29 of the probe card 6A are brought into contact with the electrode pads on the wafer W3 at a time. Further, a predetermined electrical signal is transmitted from the test head (not shown) to the electrode pads of the IC chips on the wafer W3 via the pogo pin unit 28 and the probe card 6A, thereby testing electrical characteristics of the IC chips. Thereafter, as in the case of the wafer W1, the wafer W3 is unloaded from the wafer chuck 4B by the wafer transfer mechanism 3 while moving the wafer chuck 4B to the transfer position. In the same manner, the wafer W4 loaded into the second inspection unit 21B is inspected.

In accordance with the above embodiment, the present invention includes the first and the second loading port 11 and 12 for mounting therein two carriers C facing each other, the wafer transfer mechanism 3 having the rotation center between the loading ports 11 and 12, and the first and the second inspection unit 21A and 21B being symmetrical to each other and disposed in accordance with the arrangement of the loading ports 11 and 12. In the first and the second inspection unit 21A and 21B, the positions of the wafer chucks 4A and 4B at which the wafers W are transferred, the movement regions of the wafer chucks 4A and 4B at which the wafers W are imaged and the positions of the probe cards 6A and 6B are symmetrical with respect to the horizontal line HL (see FIG. 2). In this configuration, the wafers W are directly transferred between the carrier C and the wafer chuck 4A (or 4B) of the inspection unit 21A (or 21B) by the wafer transfer mechanism 3, so that the apparatus can be miniaturized and, also, the substrate transfer efficiency increases. In addition, since the wafers W can be simultaneously inspected by the first and the second inspection unit 21A and 21B, the substrate inspection efficiency increases. As a result, a high throughput can be achieved.

The wafer transfer mechanism 3 has the three arms 31 to 33, functions for unloading two wafers W from the carrier C, sequentially transferring the two wafers W to the first and the second inspection unit 21A and 21B and receiving the inspected wafers W by using the three arms 31 to 33. As a consequence, the transfer efficiency increases. Further, the wafer transfer mechanism 3 has the pre-alignment mechanism 39 including the chuck portion 36 or the like for performing pre-alignment and thus there is no need to move to the pre-alignment mechanism 39 after the wafer W is unloaded. Accordingly, the efficiency of transferring the wafer W increases, and the extra space for installing the pre-alignment mechanism 39 is not required.

Moreover, each of the alignment bridges 5A and 5B has the three micro cameras 45 spaced apart from each other along the X direction by the distance corresponding to ⅓ of the diameter of the wafer W. Therefore, the movement region of the wafer chuck 4A or that of the wafer chuck 4B at which the surface of the wafer W imaged by the cameras 45 can be reduced.

Figure 19:
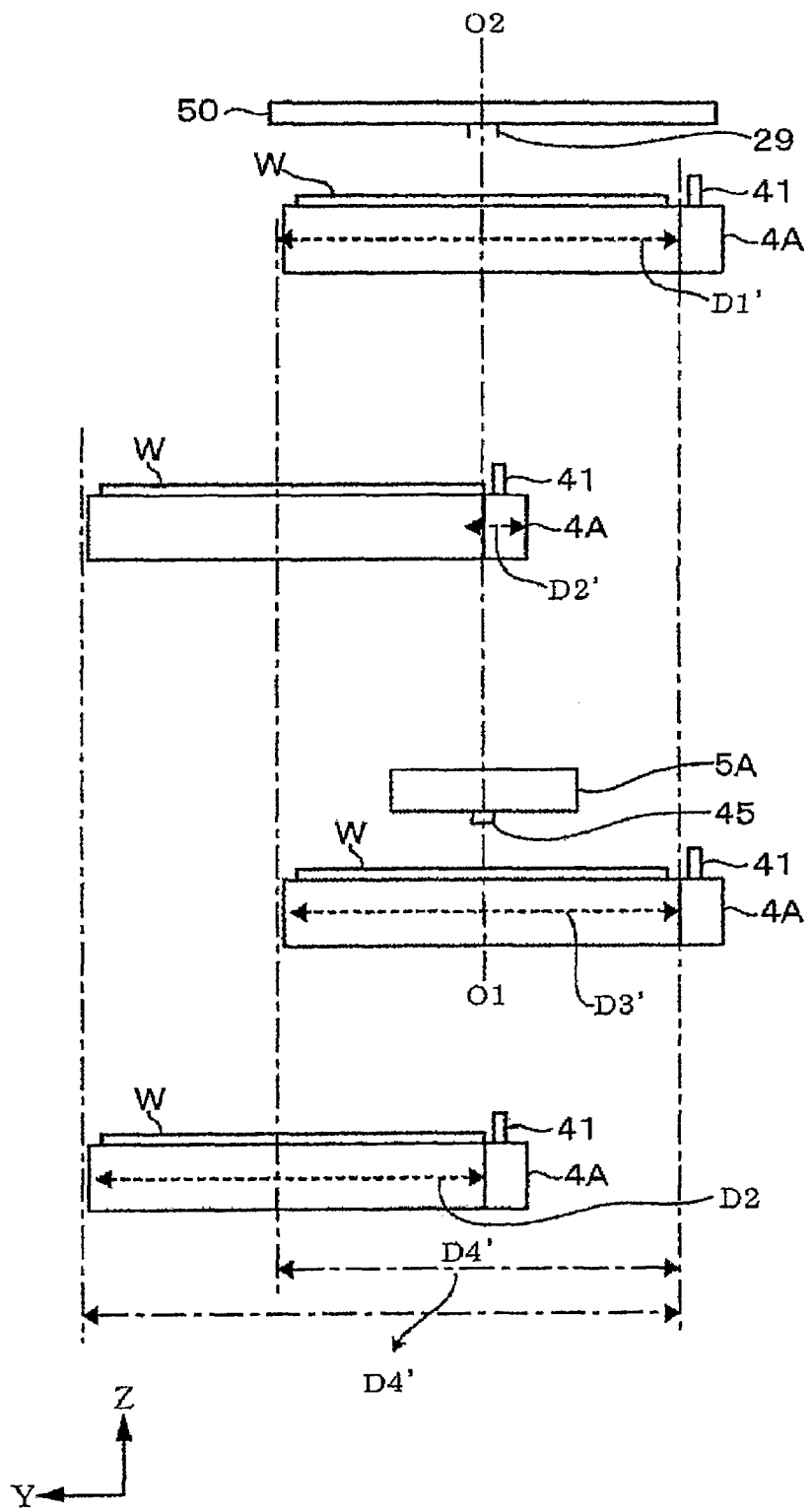
FIG. 19 is a schematic view of a movement stroke of a wafer chuck in case of using a conventional probe card for multiple contacts.

In comparison with the single contact operation, when the contact operation is performed multiple times, a central position of a movement stroke D1' of the wafer chuck 4A at which the contact operation is performed substantially coincides with the central position O2 of the probe card 50, as can be seen from FIG. 19. Further, since the imaging position of the alignment bridge 5A is aligned with the central position O2 of the movement stroke D1' (the central position O2 of the probe card 6A), a movement stroke D3' at which the wafer W is imaged becomes the same as the movement stroke D1' at which the contact operation is performed. In that case, the probe needles 29 are arranged in a small region, so that a movement stroke D2' of the wafer chuck 4A which is required to image the probe needles 29 becomes extremely short. Therefore, a movement stroke D4' of the wafer chuck 4A which includes the movement strokes D1' to D3' is minimized to be substantially the same as the driving stroke D4 obtained when using the probe card 6A.

However, if the probe needles 29 formed on the entire surface of the wafer W need to be imaged in a state where the central position of the movement stroke D1' at which the contact operation is performed is aligned with the central position of the movement stroke D3' at which the wafer W is imaged, a driving stroke D4' of the wafer chuck 4A needs to be increased to include the movement stroke D2 at which the probe needles 29 are imaged and, hence, the probe apparatus main body 2 is scaled up. Therefore, in the embodiment of the present invention, as described in FIG. 9, the central portion of the wafer chuck 4A in the movement stroke D2 at which the probe needles 29 are imaged is made to coincide with that in the movement stroke D3 at which the wafer W is imaged so that the probe apparatus main body 2 can be specialized for the probe card 6A. Accordingly, the driving stroke D4 of the wafer chuck 4A is reduced and, hence, the probe apparatus main body 2 can be scaled down.

Modification of the First Embodiment

Hereinafter, a modification of the first embodiment will be described with reference to FIGS. 20 to 23.

Figure 20:
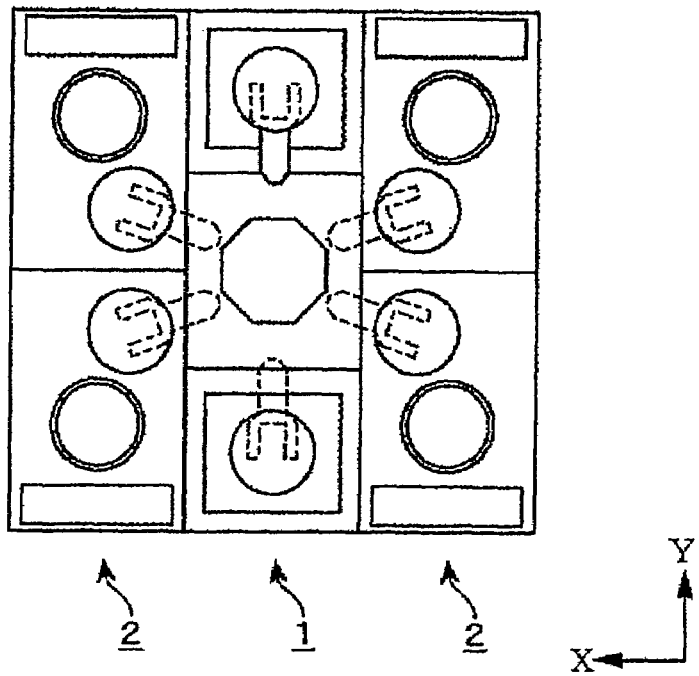
FIG. 20 depicts a top view of another configuration example of the probe apparatus.
Figure 21:
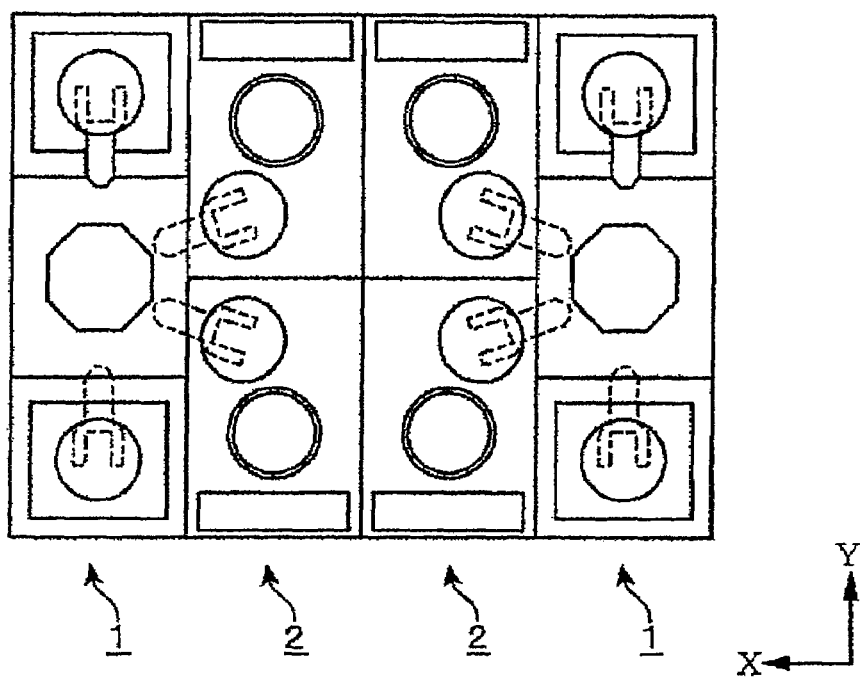
FIG. 21 provides a top view of another configuration example of the probe apparatus.

In an example of FIG. 20, the probe apparatus main bodies 2 in accordance with the first embodiment are arranged at both sides (in the X direction) of the loader unit 1. The wafer transfer mechanism 3 may have three arms 20. However, since the wafer transfer mechanism 3 is shared by four inspection units, by providing five arms (4+1) in the wafer transfer mechanism 3, the wafer transfer mechanism 3 can unload four wafers W to load them into four inspection units sequentially. In an example of FIG. 21, there are two pairs of the loader units 1 and the probe apparatus main bodies 2 in accordance with the first embodiment, wherein the probe apparatus main bodies 2 are disposed adjacent to each other.

Figure 22:
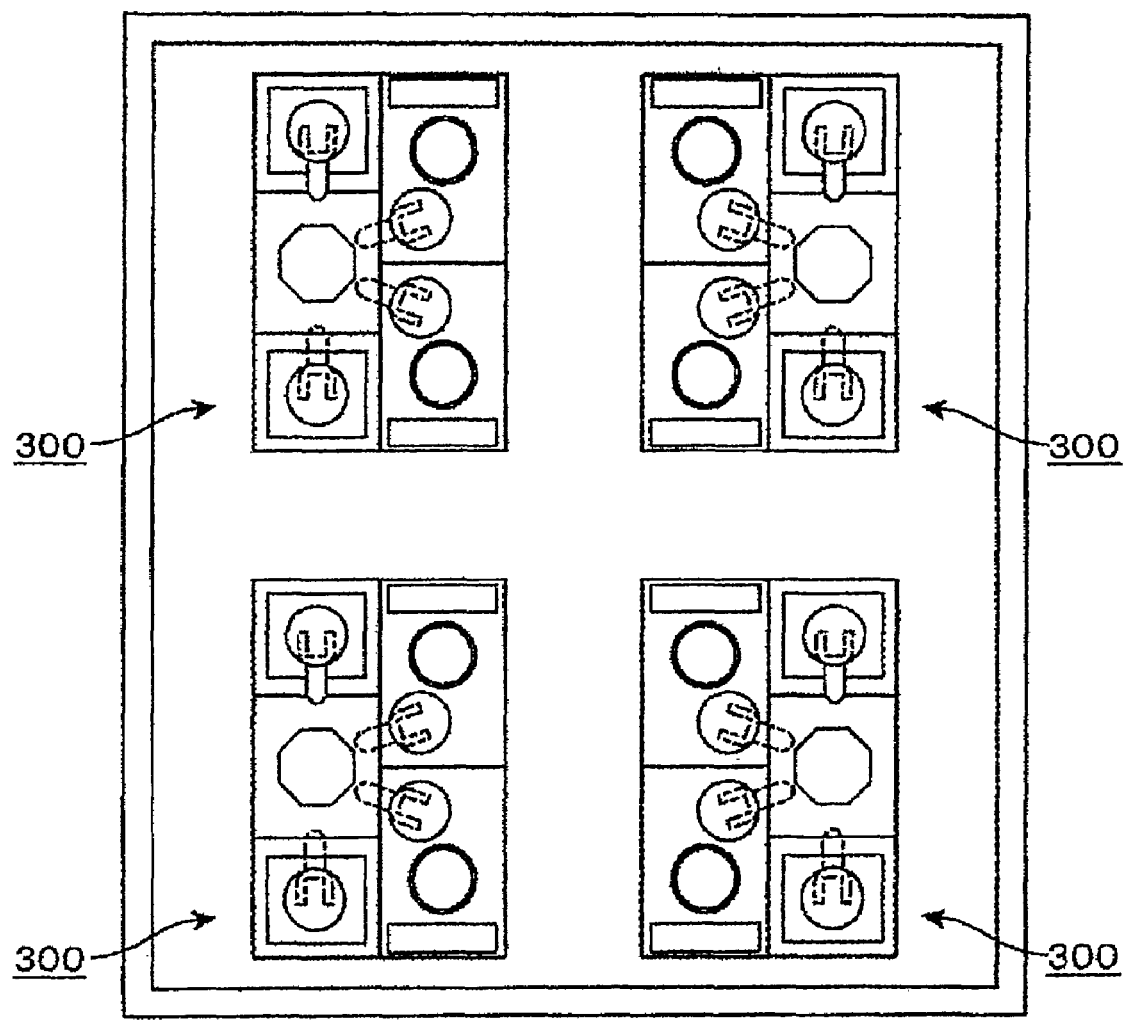
FIG. 22 depicts a top view of an example of a layout of the probe apparatus.

In an example of FIG. 22, a pair of probe apparatuses 300 in accordance with the first embodiment are arranged to be spaced from each other in the X direction so that the probe apparatus main bodies 2 face each other and, also, this pair of probe apparatuses 300 are arranged to be spaced from another pair of probe apparatuses 300 in the Y direction. The space between the probe apparatuses 300 is used as a space for moving a transfer unit (not shown) for transferring the carrier C in a clean room, or as a space for replacing the probe cards 6A and 6B.

Figure 23:
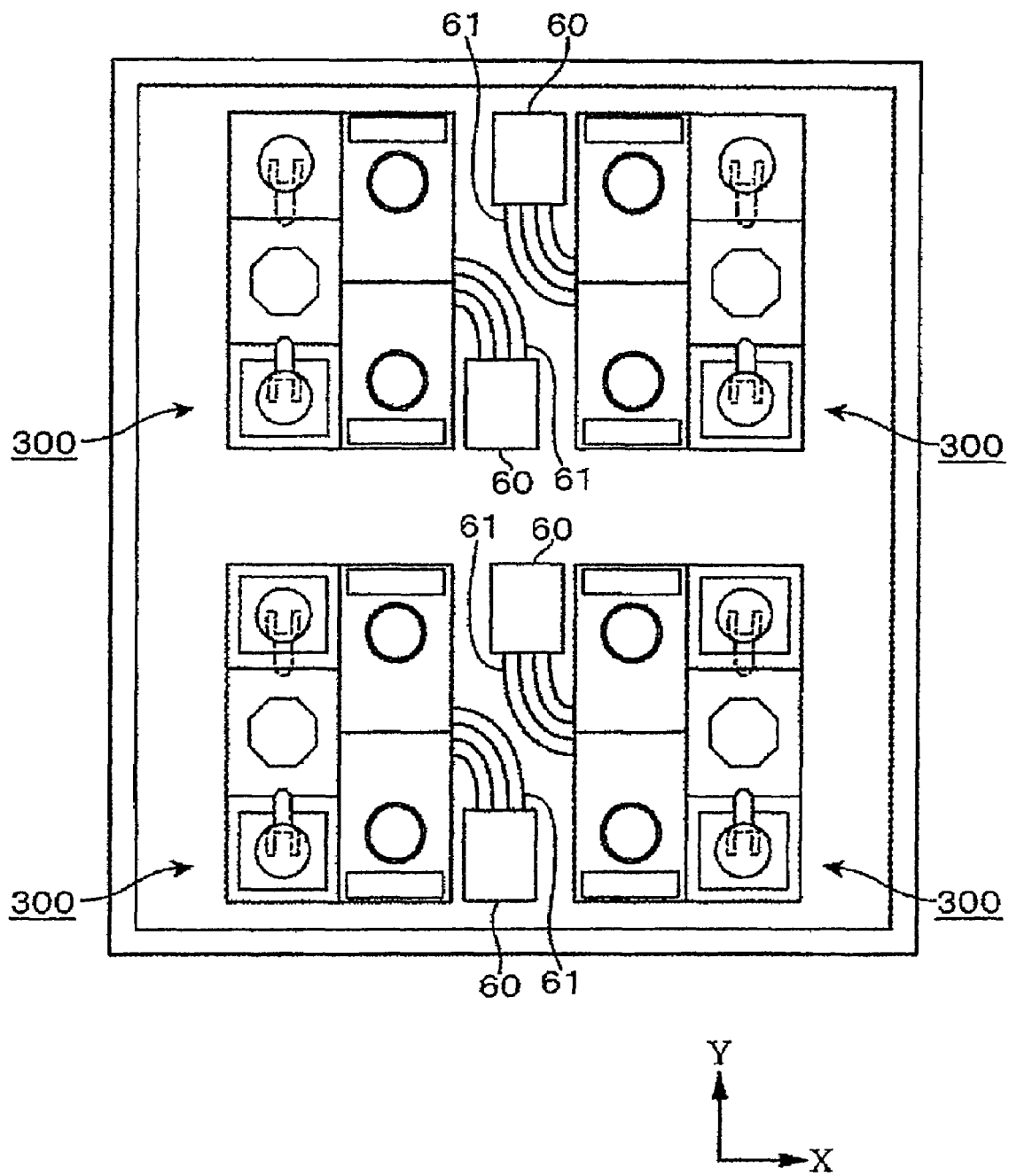
FIG. 23 describes a top view of an example of the layout of the probe apparatus.

In an example of FIG. 23, temperature controllers 60 such as chillers or the like are installed to be symmetrical with respect to a center point of the space between the two probe apparatuses 300 arranged in the X direction, to thereby control temperatures of the wafer chucks 4A and 4B. The temperature controllers 60 are connected with the probe apparatuses 300 via temperature control mediums 61. When such a layout is employed, it is possible to ensure the space for installing the probe apparatuses 300 in the clean room.

Second Embodiment

Figure 24:
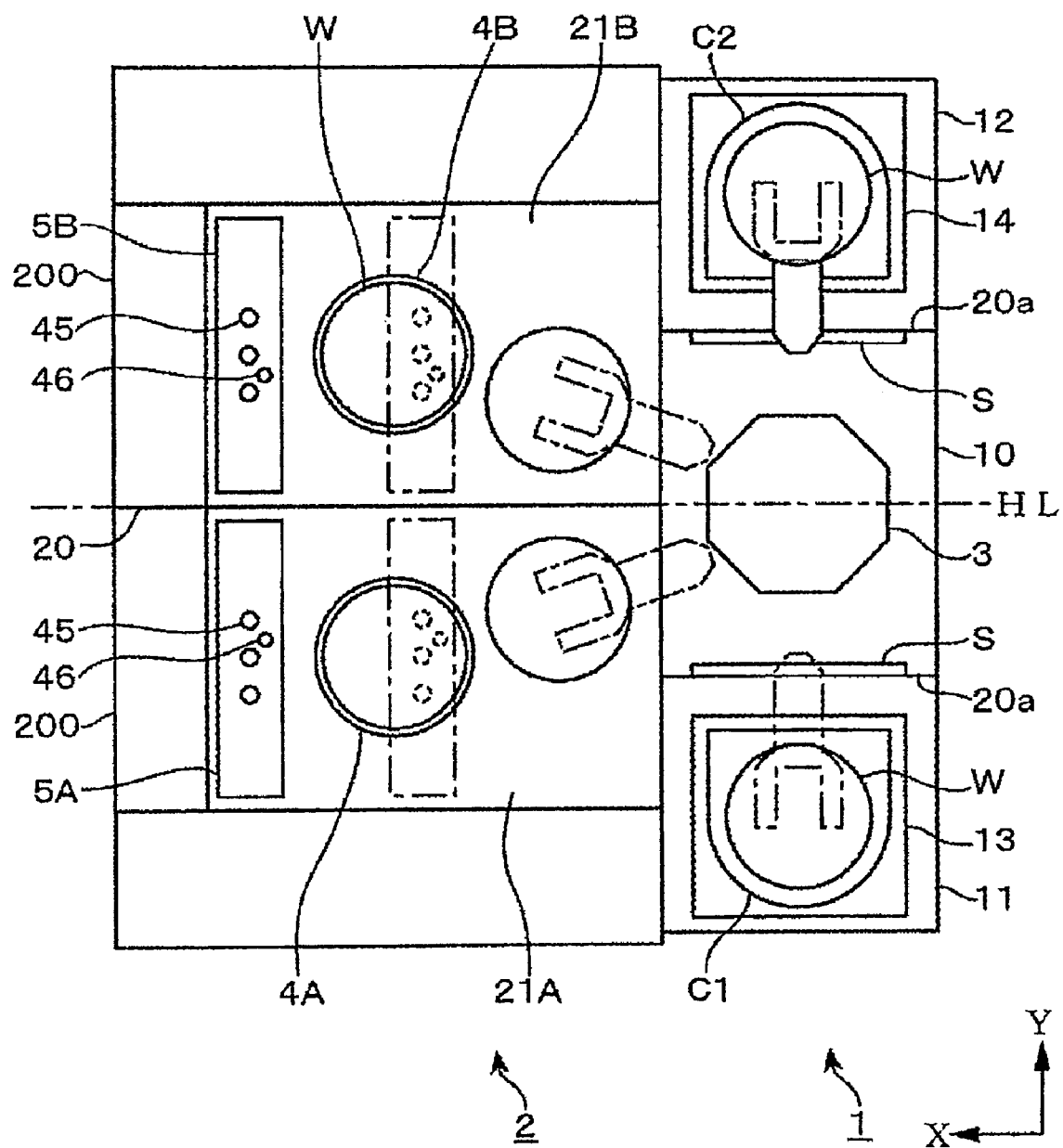
FIG. 24 shows a top view of another configuration example of the probe apparatus.

The configuration of the second embodiment is the same as that of the first embodiment except that the probe apparatus main bodies 2 are connected to the loader units 1 by rotating the inspection unit 21 by an angle of 90°, so that the moving directions of the alignment bridges 5A and 5B are perpendicular to the aforementioned moving directions as shown in FIG. 24. Accordingly, the first and the second inspection unit 21A and 21B of the second embodiment are symmetrical with respect to the horizontal line HL, as in the first embodiment. Moreover, in the probe apparatuses of this embodiment, the probe card 6A is replaced by the swing method shown in FIG. 13.

Figure 25:
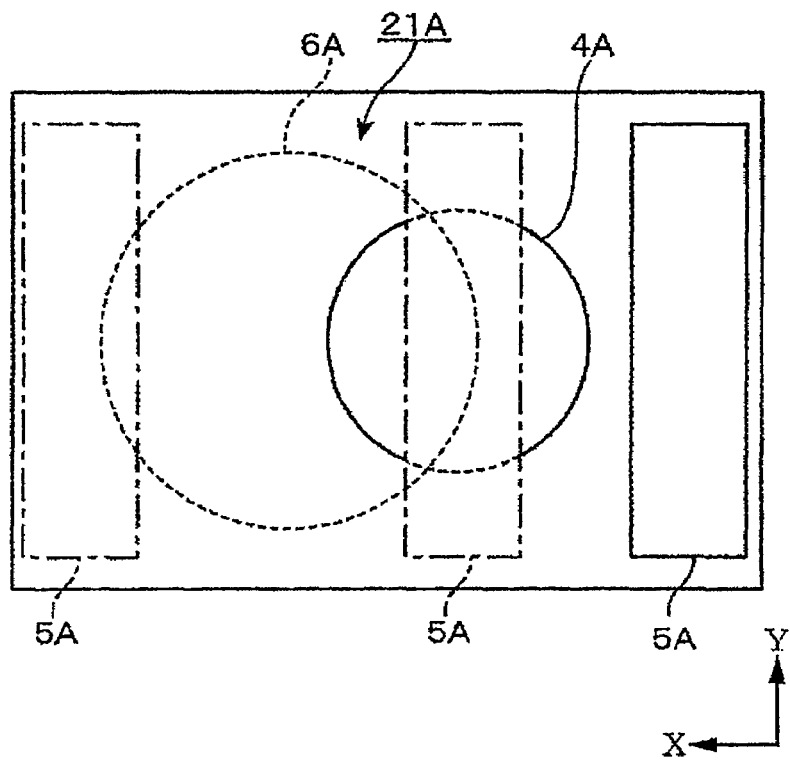
FIG. 25 offers a top view illustrating a position of an alignment bridge in the inspection unit of the probe apparatus.
Figure 26:
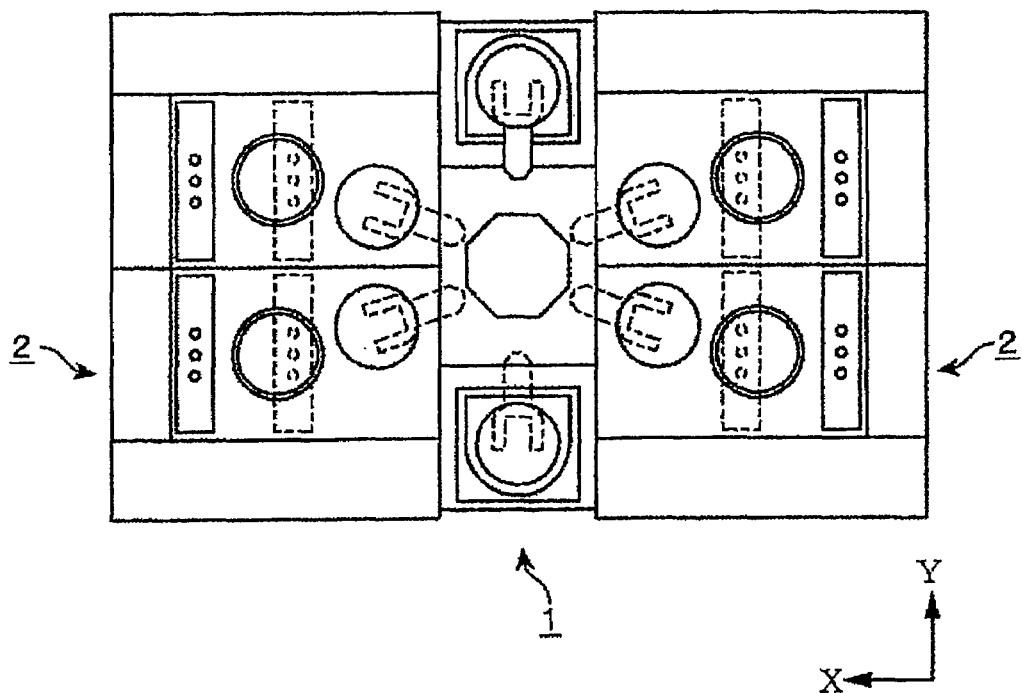
FIG. 26 presents a top view of another configuration example of the probe apparatus.

In that case, the replacement member 90 of the probe card 6A can contact with the alignment bridge 5A. Therefore, when the probe card 6A is replaced, the probe apparatus main body 2 is retreated to the position near the loader unit 1, as can be seen from FIG. 25. A reference numeral 200 indicates a replacement area of the probe card 6A. In the probe apparatus having the configuration of FIG. 26, the probe apparatus main bodies 2 can be disposed at both sides (the X direction) of the loader unit 1, as shown in FIG. 20. In the configuration of the second embodiment, the number of arms 20 can be increased to five, as described in the first embodiment.

Figure 27A:
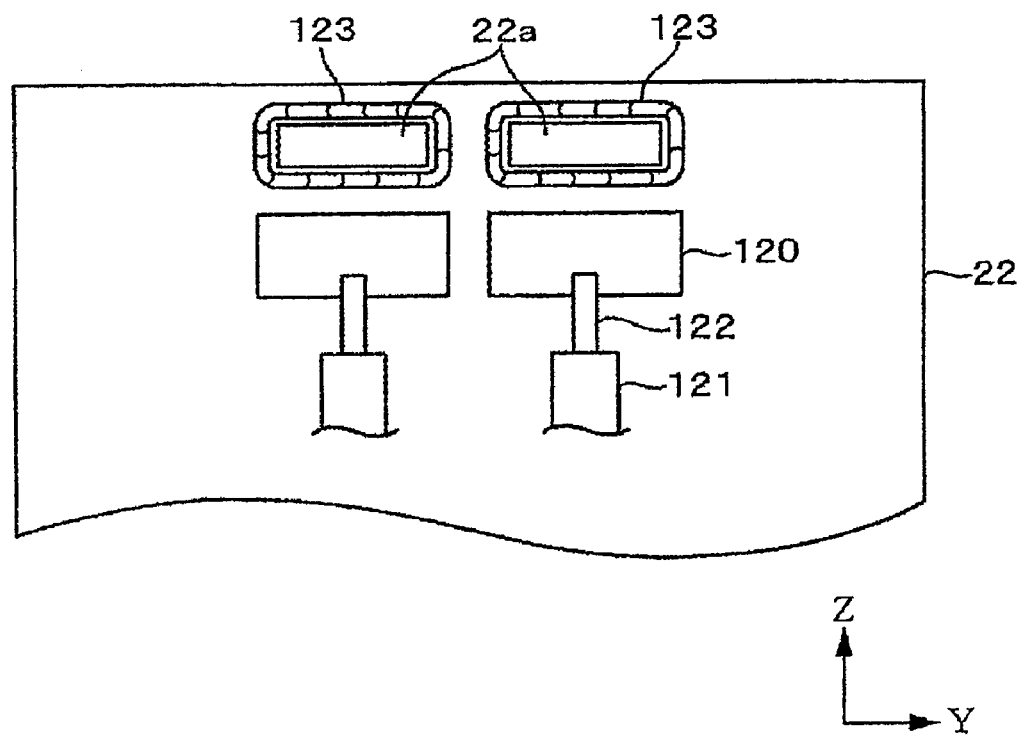
FIGS. 27A and 27B show schematic views of an example of a shutter in the probe apparatus.
Figure 27B:
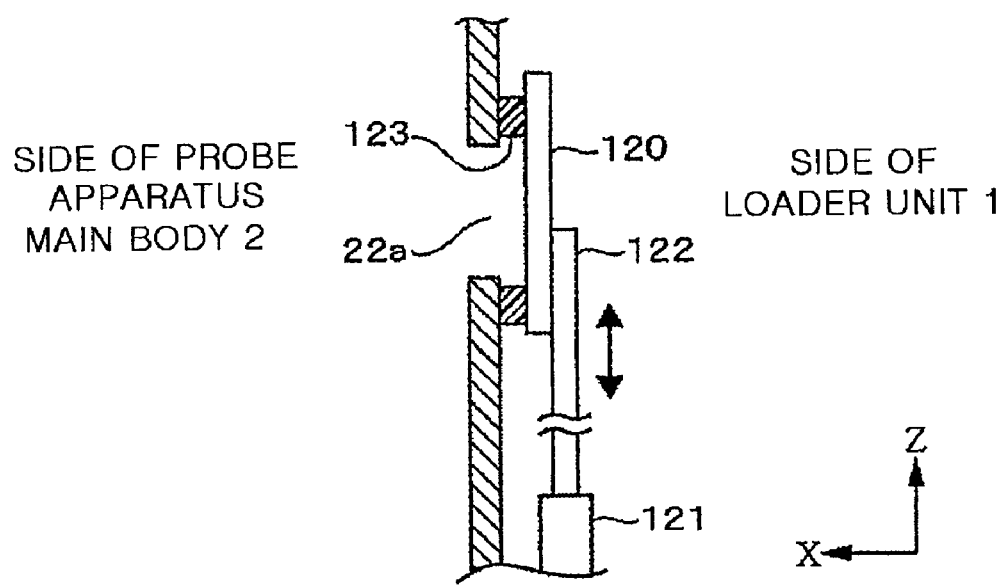

In the above embodiment, there can be provided shutters 120 for independently opening and closing two transfer openings 22a on the side surfaces of the probe apparatus main body 2, as illustrated in FIGS. 27A and 27B. To be specific, the transfer openings 22a of the loader chamber 1 side are surrounded by seal members 123 made of resin, and the shutters 120 are configured to open and close the transfer openings 22 by elevating mechanisms 121 via elevating shafts 122. In this example, the effects of the atmosphere between the inspection units 21A and 21B or that between the inspection units 21A and 21B and the loader unit 1 can be suppressed by closing the transfer openings 22a via the seal members 123.

Accordingly, when the wafer W is inspected in one of the inspection units 21A and 21B, even if the maintenance, e.g., the replacement of the probe card 6, is performed in the other inspection unit 21A or 21B, the atmosphere of the inspection is not affected by the atmosphere of the maintenance. Further, even if the atmosphere such as temperatures, humidity and the like in the respective inspection units 21A and 21B is changed, the wafer W can be inspected while maintaining the atmosphere and suppressing the effects between the atmosphere.

[Another Modification]

Figure 28A:
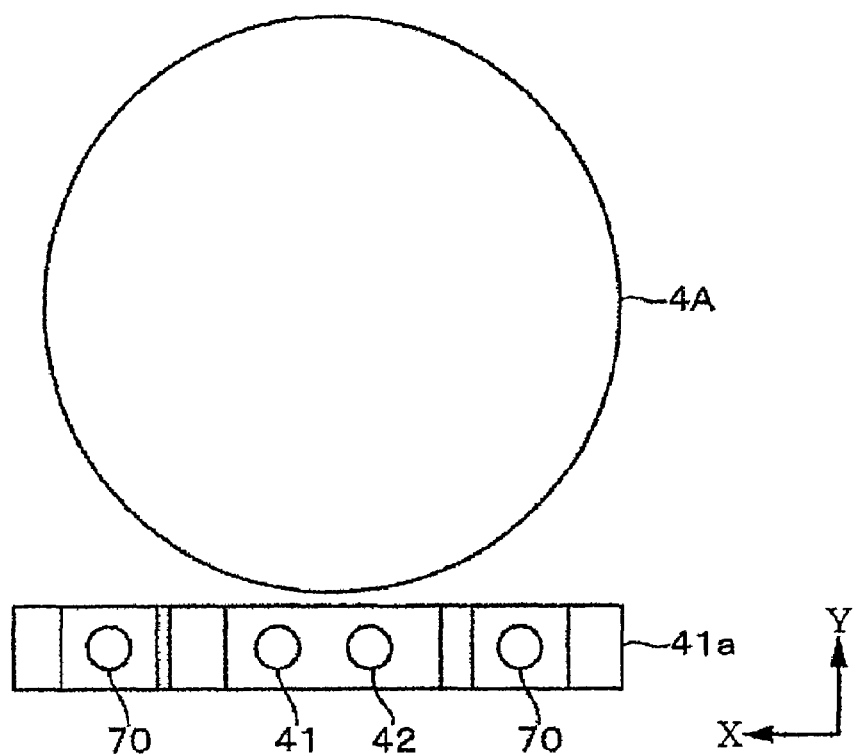
FIGS. 28A and 28B illustrate schematic views of another example of the inspection unit.
Figure 28B:
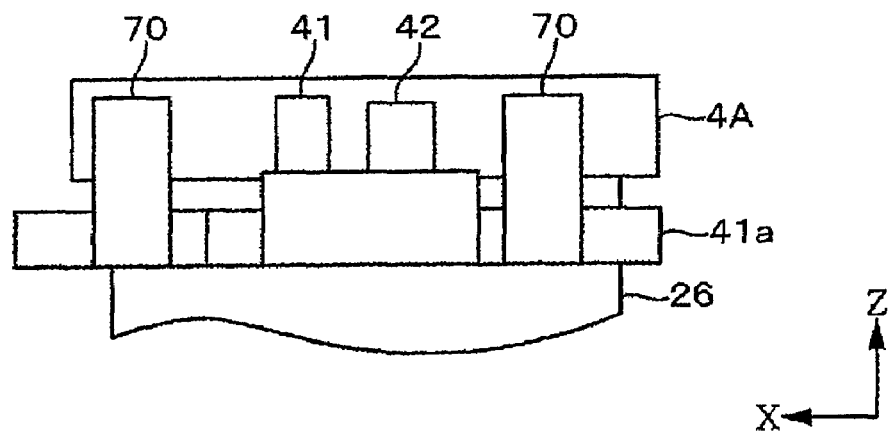

In the above example, the wafer chuck 4A has a single micro camera 41 and a single micro camera 42, as shown in FIG. 7. However, a plurality of, e.g., two, micro cameras 70 can be installed so that a pair of micro cameras 41 and 42 are provided therebetween (in the X direction), as can be seen from FIGS. 28A and 28B. The micro cameras 70 as well as the micro camera 41 are provided to image the needle tips of the probe needles 29. In this configuration, since the region where the wafer chuck 4A moves in the X direction in order to image the probe needles 29 can be reduced, the probe apparatus main body 2 can be scaled down. FIGS. 29 and 30 show movement strokes D10 and D20 of the centers of the wafer chucks 4A and 4B at which the probe needles 29 positioned at both ends in the X direction of the probe cards 6A and 6B are imaged by the single micro camera 41 and by the single micro camera 41 and two micro cameras 70 in FIG. 28, respectively. The movement stroke D20 of the latter case is considerably shorter than the movement stroke D10 of the former case. The target 44 and the reciprocating mechanism 43 are not illustrated in FIG. 28.

Further, each of the cameras (the micro cameras 41 and 70) images different areas of the probe needles 29, so that it is possible to decrease the moving amount of the wafer chuck 4A at which the probe needles 29 are imaged.

Figure 31A:
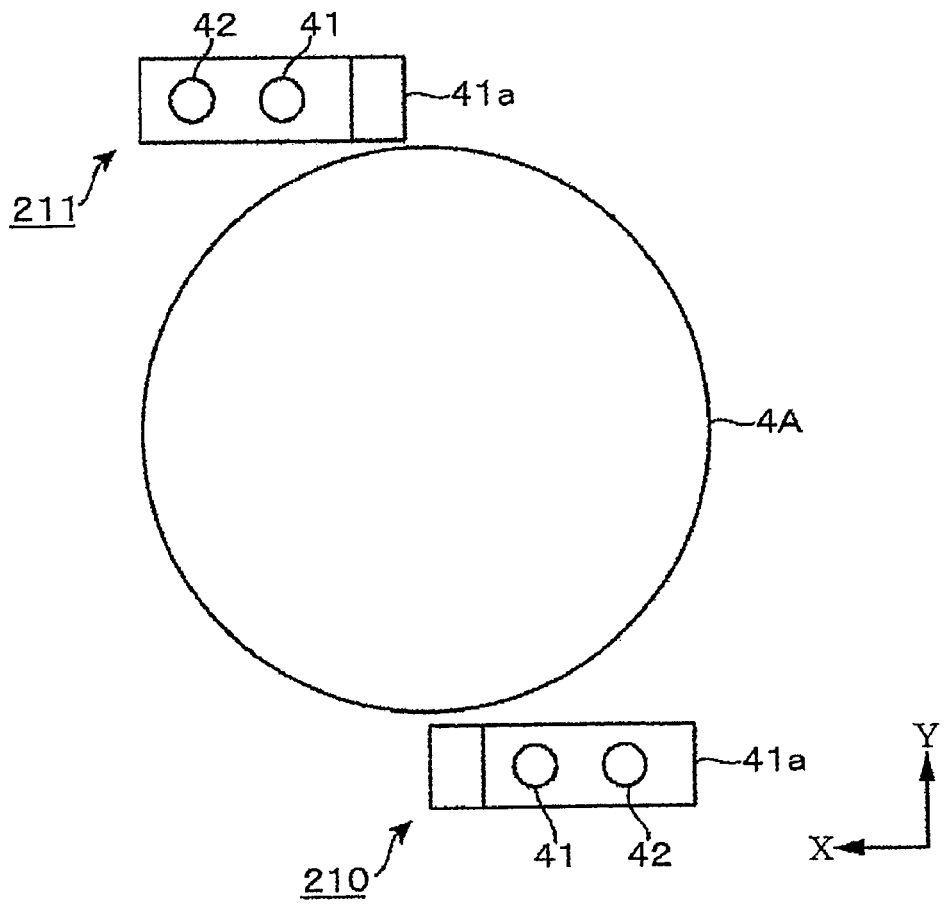
FIGS. 31A and 31B provide schematic views of another example of the inspection unit.
Figure 31B:
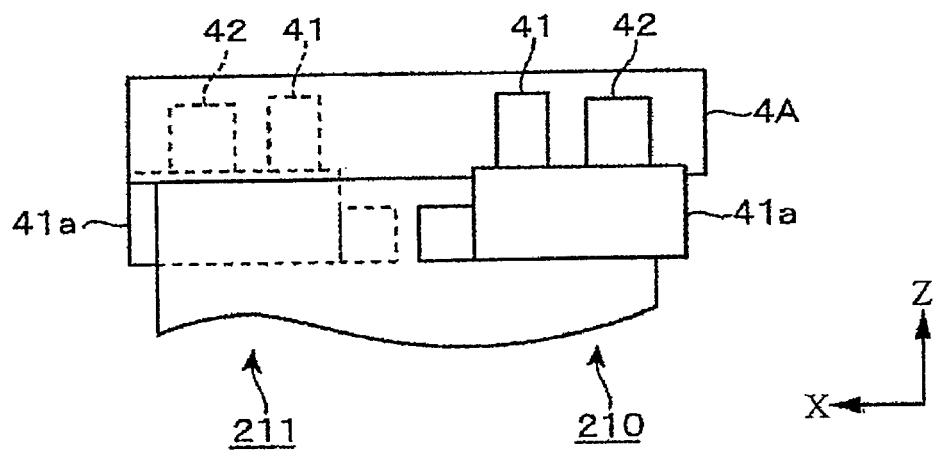

As can be seen from FIGS. 31A and 31B, the second imaging unit 211 having the same configuration as that of the first imaging unit 210 including the micro cameras 41 and 42 can be disposed to be symmetrical to the first imaging unit 210 with respect to the center of the wafer mounting region on the wafer chuck 4A or 4B. In this example, the micro camera 41 of the first imaging unit 210 is spaced from the micro camera 41 of the second imaging unit 211 in the X direction, so that the movement stroke in the X direction of the wafer chuck 4A or 4B is reduced. Moreover, the micro cameras 41 are spaced from each other in the Y direction by the diameter of the wafer chuck 4A or 4B, so that the movement stroke in the Y direction of the wafer chuck 4A or 4B is reduced substantially to a half of that obtained in case of providing a single first imaging unit 210. As a result, the probe apparatus main body 2 can be scaled down. In FIG. 31B, the first and the second imaging unit 210 and 211 positioned at both sides (inner side and front side) are respectively indicated as a solid line and a dotted line in order to clarify the positional relationship.

Further, the micro cameras 70 can be provided so that the micro cameras 41 and 42 are positioned therebetween (the X-axis side), as shown in FIG. 28.

The above probe card 6A can be used when the contact operation is performed at a time. In addition, the probe card 6A can be used when the wafer W contacts with the probe needles 29 in two steps by providing the probe needles 29 in accordance with the arrangement of electrode pad group divided into two in a diametrical direction of the wafer W, or when the wafer W is brought into contact with the area divided into four in a circumferential direction of the wafer W. In these cases, the probe needles 29 are brought into contact with the wafer W by rotating the wafer chuck 4A. In the probe apparatus of the present invention, it is preferable to inspect the wafer W by performing the contact operation once to four times.

In the above example, the number of the micro cameras 45 is three. However, the number of the micro cameras 45 can be two or four. If the number of micro cameras 45 provided is n, the distance therebetween is preferably set to be 1/n of the diameter of the wafer W.

In the above example, two or three wafers W are simultaneously transferred by the three arms 30, thereby shortening time for transferring the wafers W. However, even if the number of the arms 30 is less than three, e.g., one, it is possible to adjust the direction of the wafer W and correct its eccentricity by the pre-alignment mechanism 39 based on the direction of loading the wafer W into the inspection unit 21.

When the processing of the wafers W (the fine alignment or the inspection of electrical characteristics) in the probe apparatus main body 2 is completed within a preset period of time, each of the wafers W is sequentially processed, as described above. However, when the processing of the wafer W in the first or the second inspection unit 21A or 21B is delayed due to the error or the like, it is not possible to transfer a wafer W to be processed to the first or the second inspection unit 21A or 21B. In that case, since the wafer transfer mechanism 3 has the pre-alignment mechanism 39, the transfer position can be changed as will be described later and, hence, the processing can be continued without any delay.

A specific example of the above case is described as follows. Although the wafer W to be processed in, e.g., the first inspection unit 21A is maintained under the wafer transfer mechanism 3, the processing of the wafer W in the first inspection unit 21A is not completed, whereas the processing of the wafer W in the second inspection unit 21B is completed.

When the wafer transfer mechanism 3 holding thereon the wafer W unloaded from, e.g., the first carrier C1 is lowered, the direction of the wafer W held on the wafer transfer mechanism 3 has been adjusted in advance based on a predetermined transfer position (the first inspection unit 21A). Thus, if the transfer position of the wafer W is changed, the direction of the wafer W is accordingly changed to thereby accommodate the newly changed transfer position (the second inspection unit 21B) in the same manner as when the wafer W is unloaded from the carrier C and, then, the wafer W is loaded into the second inspection unit 21B. By changing the transfer position when necessary according to the actual wafer processing time, it is possible to reduce the unnecessary time that the probe apparatus main body 2 waits without performing the processing.

Figure 32A:
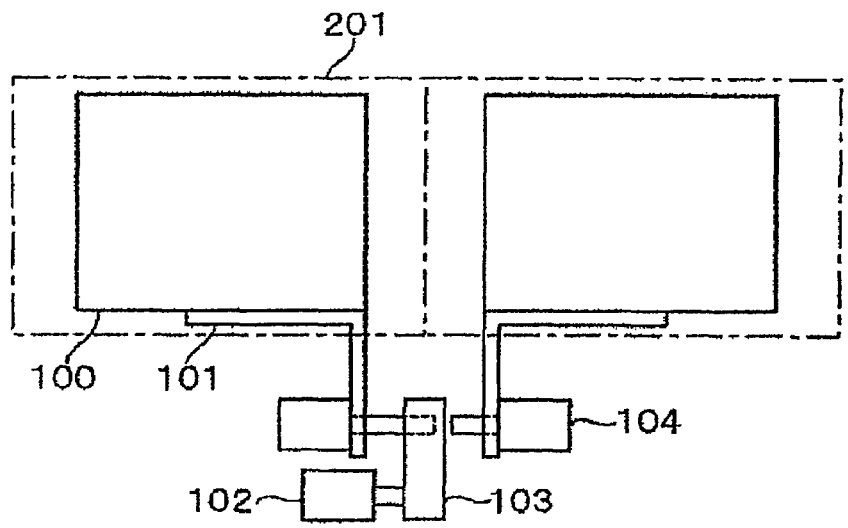
FIGS. 32A and 32B are top views presenting an example of a process for replacing a probe card in a probe apparatus main body.
Figure 32B:
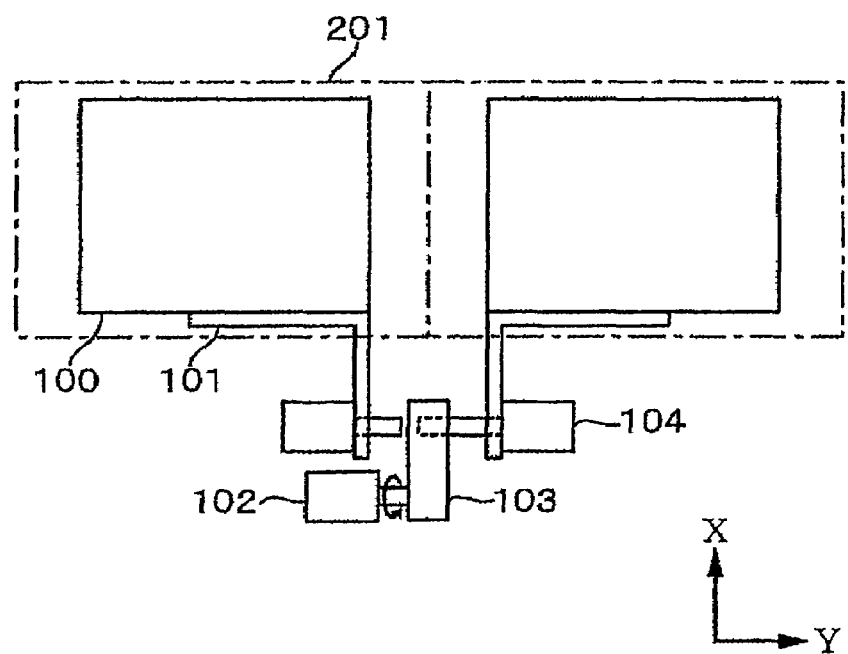

Hereinafter, an example of a hinge mechanism of a tester 100 positioned above the pogo pin unit 28 will be described. FIGS. 32A and 32B are top views of the tester 100 installed on the probe apparatus main body 2. The tester 100 has on its side surfaces L-shaped rotation plates 101. Further, a driving member 103 rotating about a horizontal axis by a motor 102 is provided between portions of the rotation plates 101 coming out of the tester 100. Moreover, each of the plates 101 has a connection member 104 connected to the driving member 103, the connection member 104 being capable of moving in the Y direction by a driving unit (not shown). By advancing the connection member 104, it can be connected with the driving member 103 and by retreating the other connection member 104, connection can be released. With this, it is possible to open or close each of the testers 100 to contact with the pogo pin unit 28 or be separated from the pogo pin unit 28 by the motor 102 serving as a common driving unit.

Hereinafter, an example of the wafer transfer process of the wafer transfer mechanism 3 will be described with reference to FIGS. 33 and 34. FIGS. 33 and 34 illustrate a series of sequential processes including the unloading of the wafers from the carriers C1 and C2, the loading of the wafers into the inspection units 21A and 21B, the inspection of the wafers W and the return of the inspected wafers to the carriers C1 and C2. A vertical direction indicates the time elapse, and a left end column represents the processing state. "LotStart" in the left end column indicates a start of a series of operations including the unloading of wafers from the carrier and the inspection of the wafers; "Waf.1Start" indicates a start of the inspection of Waf.1 by the tester; and "Waf.1End" represents a completion of the inspection of Waf.1 by the tester.

A second column from the left side and the right end column indicate Stage 1 and Stage 2, i.e., the states of the wafer chucks 4A and 4B, respectively. "Waf.1" indicates the state where Waf.1 is mounted on a corresponding wafer chuck; "Alignment" represents a state while the contact position is calculated by imaging the wafer W and the probe needles 29; and "Test" indicates the state where the wafer is being tested. For convenience, the numerical reference "Waf.1" or the like is applied in accordance with the sequence of unloading wafers from the carriers C1 and C2.

Further, the third to the fifth column from the left side indicate the states of the upper arm 31, the middle arm 32 and the lower arm 33, respectively. In those columns, "Waf.1" indicates the state where Waf.1 is maintained, and "Carrier" represents the state where the wafer that is being maintained is transferred to the carrier C1 or C2.

Each line indicates the states of the wafer chucks 4A and 4B and the states of the arms 31 to 33 during a specific period of time, i.e., the steps of the sequential programs. Namely, FIG. 33 depicts the sequence of the operation of the apparatus. First of all, the instruction of "LotStart" is given by the control unit 15 (see FIG. 2). Next, Waf.2 and Waf.1 are unloaded from, e.g., the carrier C1, by the upper arm 31 and the middle arm 32 of the wafer transfer mechanism 3, respectively. Then, Waf.1 is transferred to the stage 1, and, then, Wafer.1 is aligned while Waf.2 is transferred to the stage 2.

Thereafter, Waf.1 is inspected and, at the same time, Waf.2 is aligned. At this time, the empty three arms 31 to 33 move to the carrier C1 to receive Waf.3 and Waf.4, and Waf.4 and Waf.3 are mounted on the upper arm 31 and the middle arm 32, respectively. Next, the inspection of Waf.2 is started and, then, the inspection of Waf.1 is completed. At this time, the empty lower arm 33 moves to the stage 1 to receive Waf.1, and transfers Waf.3 mounted on the middle arm 32 to the stage 1.

While Waf.3 is aligned, Waf.1 mounted on the lower arm 33 is restored to the carrier C1 and, at the same time, the empty middle arm 32 moves to the carrier C1 to receive Waf.5. Next, the inspection of Waf.3 is started, and the inspection of Waf.2 on the stage 2 is completed. Accordingly, the empty lower arm 33 receives Waf.2, and Waf.4 mounted on the upper arm 31 is transferred to the stage 2. While Waf.4 is aligned, Waf.2 on the lower arm 33 is returned to the carrier C1 and, at the same time, the empty upper arm 31 moves to the carrier C1 to receive Waf.6. Thereafter, the inspection of Waf.4 is started. After the inspection of Waf.4 is started, the following wafers are transferred and inspected in the same manner.

As can be seen from the above, in this example, the upper arm 31 and the middle arm 32 transfer the wafers from the carrier C1 to the stages 1 and 2, and the lower arm 33 transfers the inspected wafers from the stages 1 and 2 to the carrier C1.

The steps described in the blocked lower portion of FIG. 33 indicate that the error occurring in the stage 1 is released by an operator. "Stage1AssistOccur" and "Stage1AssistRelease" correspond to the occurrence and the release of the error, respectively. The steps described in the blocked lower portion are continued from the step of Waf.10Start. Further, FIG. 34 shows steps continued from the steps of FIG. 33. That is, since these steps are long, one figure is divided into FIG. 33 and FIG. 34. "Stage1ErrorOccur" (separation) indicates a state where the stage 1 is separated from the system due to the error that cannot be dealt with the operator.

Further, Initial start and Initial end represent that the initialization is executed to release the error occurring in the stage 1 (the initialization is executed by manipulating the switch by an operator, and the processing includes the initialization of inner data and the initialization of the stage relationship). The start of the initialization is indicated as InitialStart, and the completion of the initialization is indicated as InitialEnd. "IfWaf.9Tested" and "IfWaf.9UnTested" represent the case where Waf.9 is tested and the case where Waf.9 is not tested, respectively. In addition, "Stage1/2SimultaneouslyCleaning" indicates the consecutive cleaning of the stages 1 and 2. The cleaning is carried out by polishing the needle tips of the probe needles by using a NPW (non-product wafer).

Figure 36:
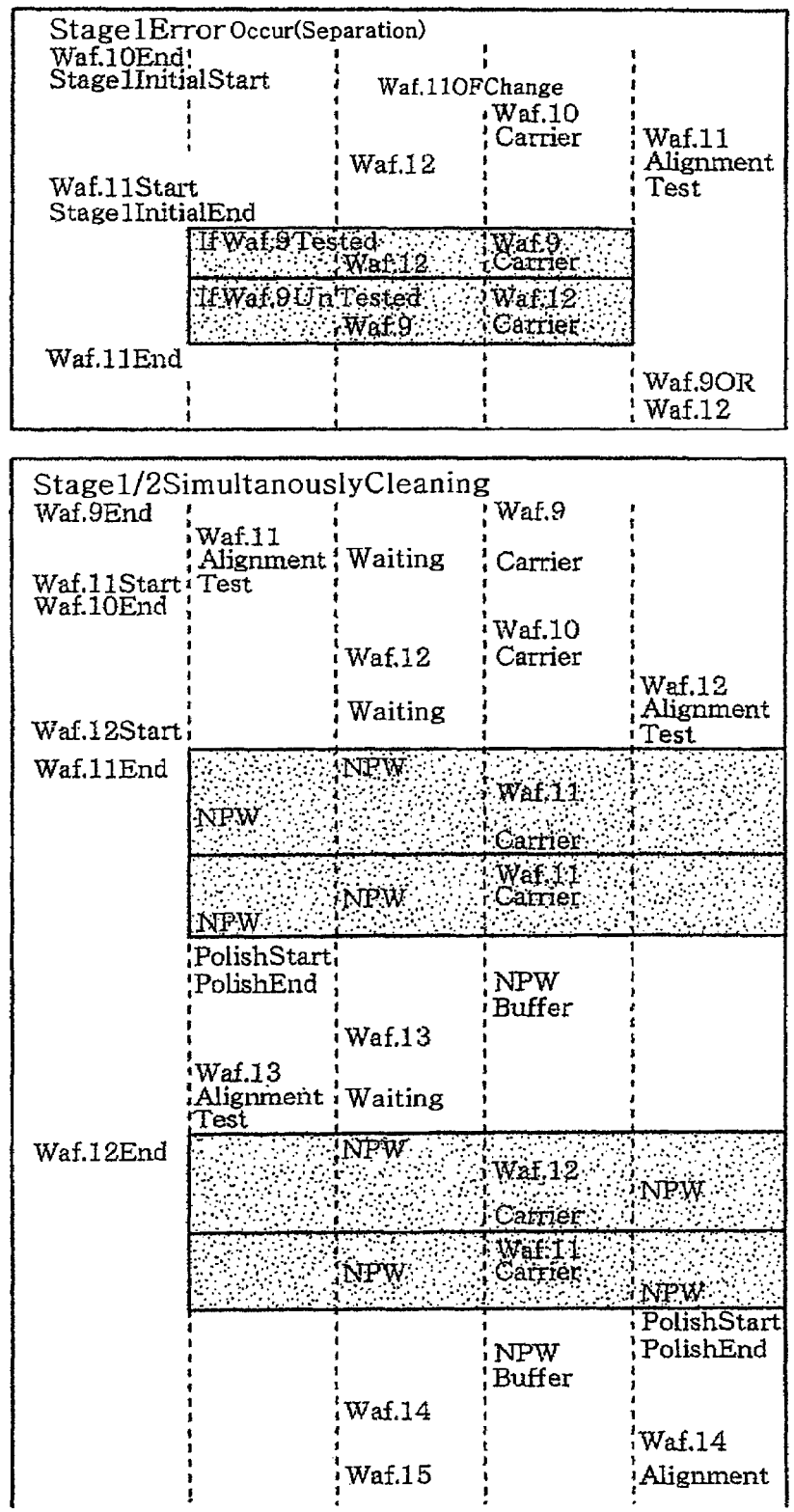
FIG. 36 explains a sequence of transferring a wafer by using the wafer transfer mechanism having two arms.

FIGS. 35 and 36 depict sequences in case of providing two arms at the wafer transfer mechanism 3 in the apparatus, e.g., the apparatus of the first embodiment, for performing the sequences of FIGS. 33 and 34. As can be seen from these sequences, in a case where the wafer could not be loaded into the stage 1 or 2 due to an error occurring in the inspection unit 21A or 21B, i.e., the case where an error occurred in the stage 1 or 2, and then, the error has been solved, or in a case where the probe needles in the inspection unit 21A or 21B are cleaned, a higher throughput can be obtained in the case where the wafer transfer mechanism 3 has three arms than in the case where the wafer transfer mechanism 3 has two arms.

Figure 37:
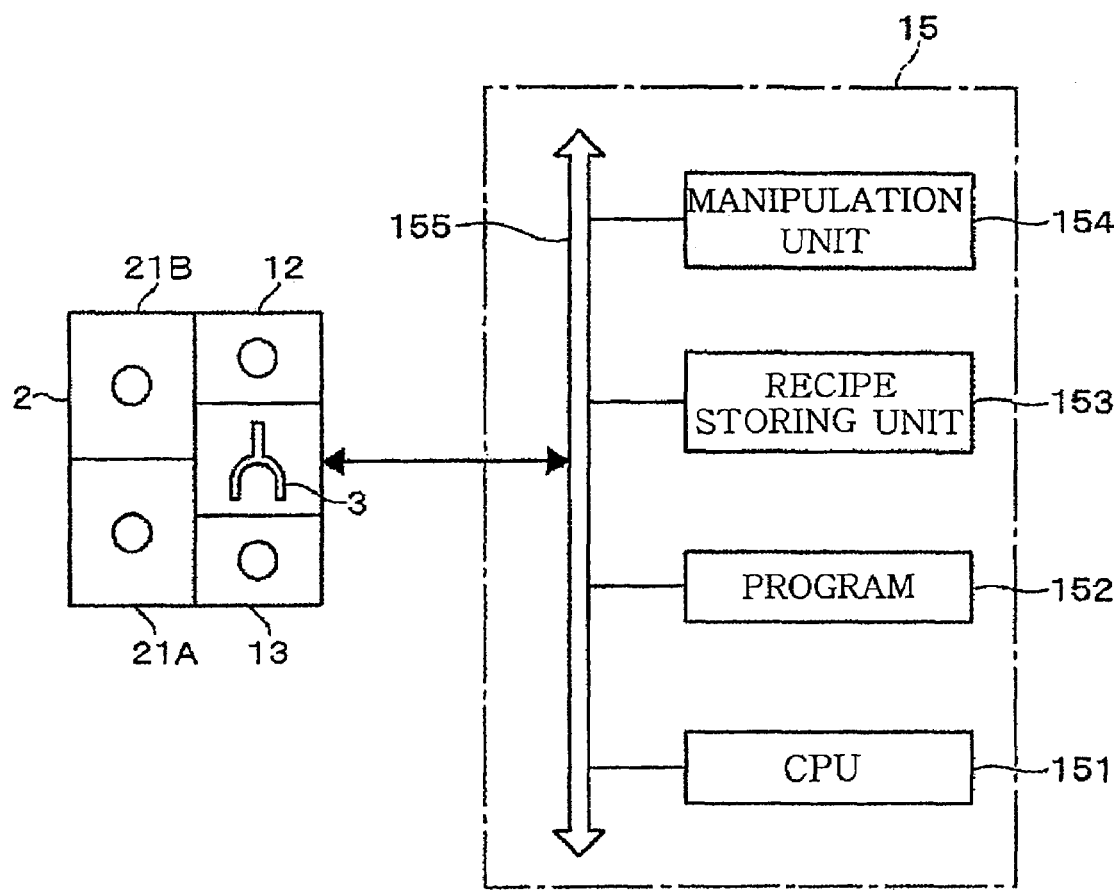
FIG. 37 illustrates an example of a configuration of a control unit used in accordance with the embodiment of the present invention.

FIG. 37 shows an example of the configuration of the control unit 15 of FIG. 2. A reference numeral 151 indicates a CPU; a reference numeral 152 indicates a program for executing a series of processes of the probe apparatus; a reference numeral 153 indicates a recipe storing unit for storing recipes of the inspection performed in the inspection units 21A and 21B; a reference numeral 154 indicates a manipulation unit for performing an operation or setting an operation mode or parameters of the probe apparatus; and a reference numeral 155 represents a bus. The manipulation unit 154 has a display such as a touch panel or the like, and an example of a part of the manipulation display is illustrated in FIG. 38.

Figure 38:
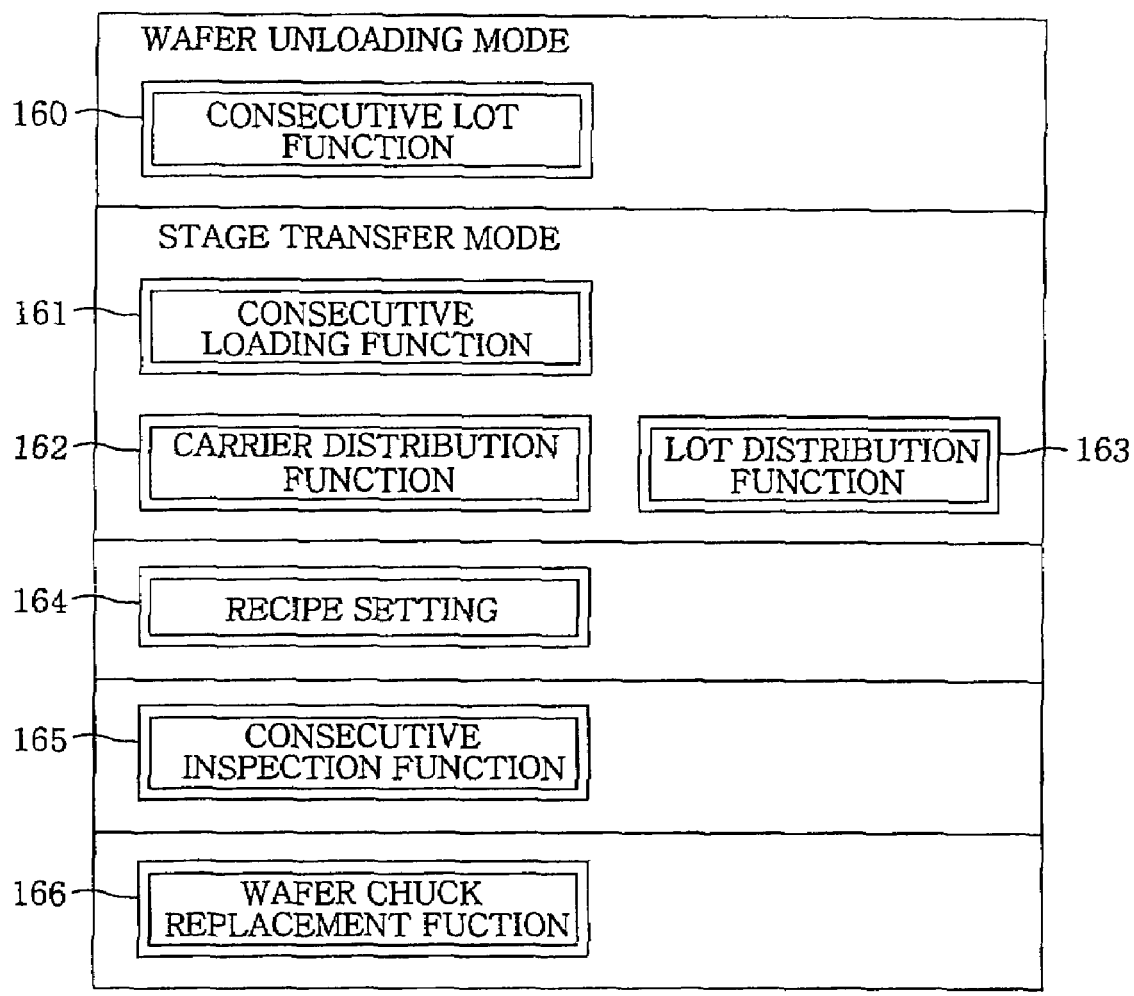
FIG. 38 explains a part of a manipulation display used in the control unit.

In FIG. 38, a reference numeral 160 indicates a soft switch for setting a consecutive lot function forming a wafer unloading function. When the soft switch 160 is ON, following operations are carried out. To be specific, in the case where the wafers in the carrier C1 corresponding to a single lot are sequentially unloaded, if a last wafer to be inspected is unloaded by, e.g., the middle arm 32, a first wafer to be inspected in the carrier C2 corresponding to a lot is unloaded by, e.g., the upper arm 31, in a state where the last wafer to be inspected in the carrier C1 is mounted on the middle arm 32. For example, if Waf.9 in FIG. 33 is a final wafer in the carrier C1, Waf.10 corresponds to a first wafer to be inspected in the carrier C2.

Namely, when a wafer of a previous lot (e.g., the carrier C1) is mounted on one of the arms of the wafer transfer mechanism 3, unloading a wafer of a next lot (e.g., the carrier C2) by using another arm is performed before the wafer of the previous lot is loaded into the inspection unit. Therefore, a high throughput can be obtained by consecutively processing different lots.

When the consecutive lot function is not set, a wafer of a next lot (carrier) is unloaded after a wafer of a previous lot (carrier) is loaded into the inspection unit by the arm of the wafer transfer mechanism 3.

A reference numeral 161 is a soft switch for setting a consecutive loading function forming the wafer unloading mode. When the switch 161 is ON, following operations are performed. That is, when a wafer in one of the carriers is mounted on one of the wafer chucks 4A and 4B, if the other wafer chuck is empty, a wafer in the other carrier is loaded onto the empty wafer chuck. For example, even when a final wafer to be inspected in one of the carriers is inspected in one of the wafer chucks, a first wafer to be inspected in the other carrier can be loaded onto the other wafer chuck.

A reference numeral 162 indicates a soft switch for setting a carrier distribution function. When the switch 162 is ON, a display for distributing the inspection units for the two loading ports 12 and 13 is displayed so that the distribution can be performed. For example, a wafer in the carrier on the loading port 12 is transferred to the first inspection unit 21A, and a wafer in the carrier on the loading port 13 is transferred to the second inspection unit 21B.

A reference numeral 163 indicates a soft switch for setting a lot distribution function. When the switch 163 is ON, wafers are sequentially transferred from the carrier on one of the loading ports 12 and 13 to an empty wafer chuck. This function can be applied to both of the loading ports 12 and 13, or to any one of the loading ports by using an additional display.

A reference numeral 164 indicates a soft switch for setting a recipe in the inspection unit. When the switch 164 is ON, a recipe setting display is displayed so that a recipe can be set for the respective inspection units. A common recipe or different recipes can be set for the inspection units 21A and 21B. The recipe setting includes setting of temperatures of the wafer chucks, setting for determining whether all the chips on the wafer will be inspected or only defective chips will be inspected and the like.

A reference numeral 165 is a soft switch for setting a consecutive inspection function. When the switch 165 is ON, a detailed setting display is displayed, and wafers are transferred from one of the inspection units 21A and 21B to the other inspection unit according to a determined inspection sequence of the inspection units.

For example, the wafers are inspected in the inspection unit 21A and then in the inspection unit 21B without being restored to the carrier. In that case, all the chips are inspected in the inspection unit 21A, and only the chips determined to be defective in the inspection unit 21A are inspected in the inspection unit 21B. In that case, the defective chips can be marked in the inspection unit 21A. The inspection in the inspection unit 21A can be performed at a first temperature, and the inspection in the inspection unit 21B may be performed at a second temperature. When the switch 165 is OFF, the wafer is inspected by only one of the inspection units.

A reference numeral 166 indicates a soft switch for setting a wafer chuck replacement function. When the switch 166 is ON, if an error occurs in one of the inspection units 21A and 21B, the processing can be carried out by the other inspection unit 21A or 21B.

In the present invention, the wafers mounted on the two wafer chucks 4A and 4B can be simultaneously inspected by a common tester for the two inspection units 21A and 21B. In that case, the common tester is installed separately from the apparatus main body 2, and the probe cards 6A and 6B are connected with the common tester via cables.

The following is a description of a preferable example of the second imaging units mounted on the alignment bridges 5A and 5B shown in FIGS. 2, 3 and 5. In the above example, there are provided the three micro cameras 45 of high magnification cameras, as depicted in FIG. 18 and the like. In a following example, however, there are provided two micro cameras. Further, since the alignment bridges 5A and 5B have a same configuration, the alignment bridge 5A will be described representatively. Hereinafter, the X direction (see FIG. 2) indicates a right and left direction, for convenience.

Figure 39:
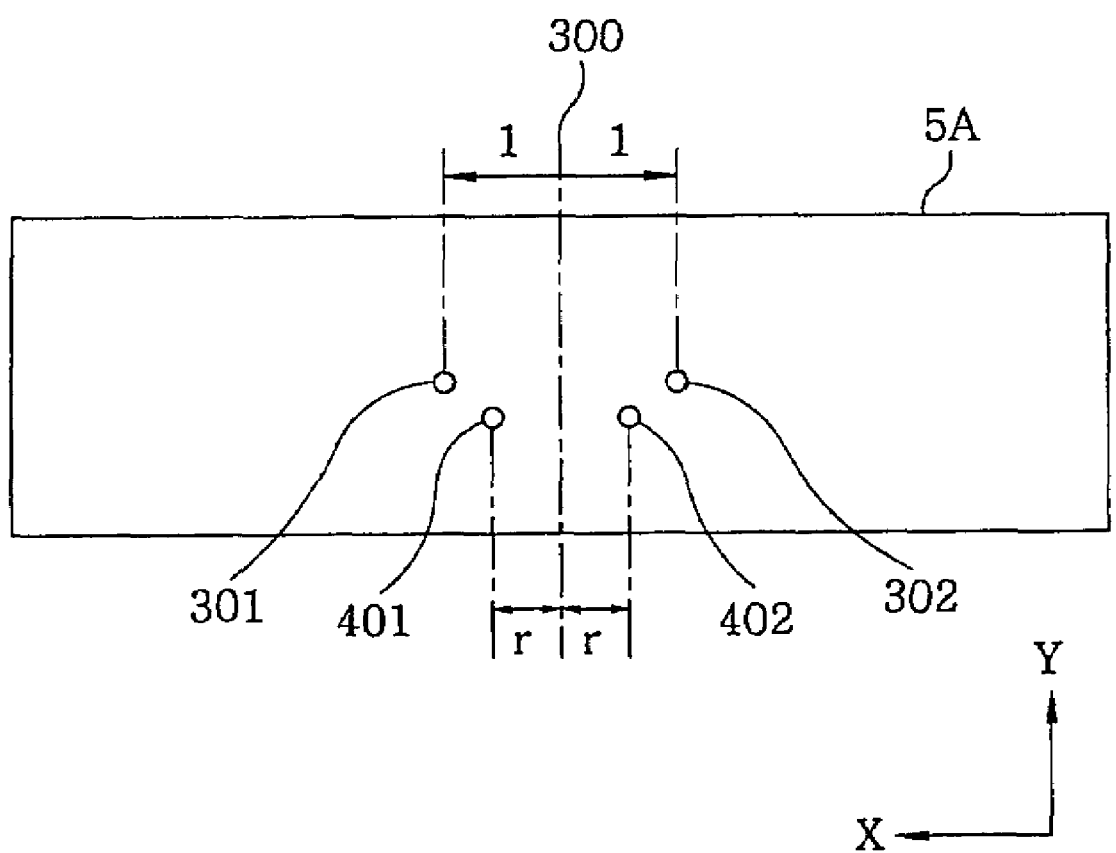
FIG. 39 depicts a top view of another example of the alignment bridge in accordance with the embodiment of the present invention.

As illustrated in FIG. 39, the alignment bridge 5A has micro cameras 301, 302, 401 and 402. The micro cameras 301 and 401 are symmetrical to the micro cameras 302 and 402 with respect to a central line 300 dividing the alignment bridge 5A into a right and a left part. The micro cameras 301 and 302 are positioned closer to the horizontal line HL (see FIG. 2) as a boundary between the first and the second inspection unit 21A and 21B, compared to the micro cameras 401 and 402. A distance l between the micro cameras 301 and 302, and the central line 300 is about, e.g., 73 mm. Further, a distance r between the micro cameras 401 and 402 and the central line 300 is about, e.g., 45 mm.

Figure 40A:
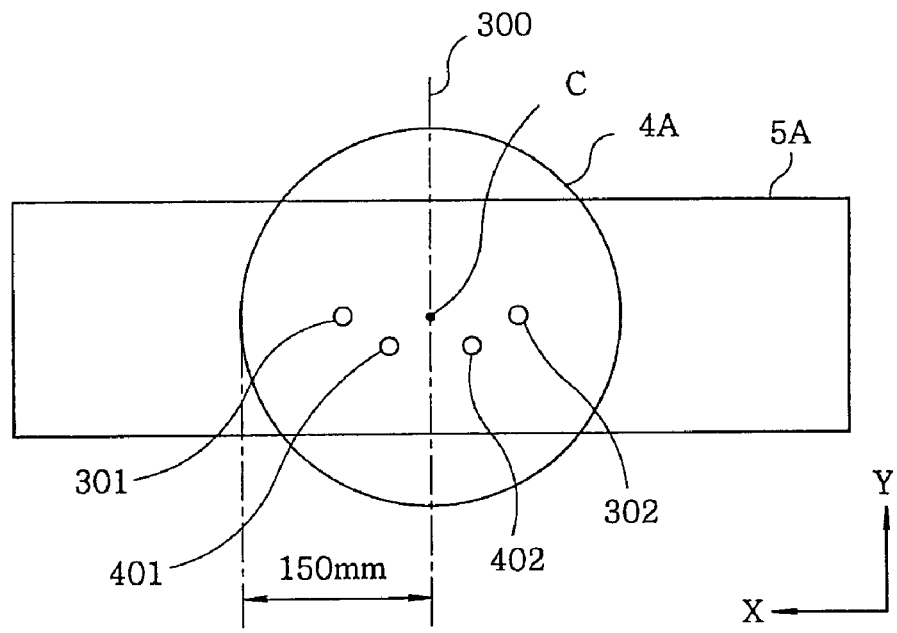
FIGS. 40A and 40B explain a movement of the wafer chuck in case of using the alignment bridge.
Figure 40B:
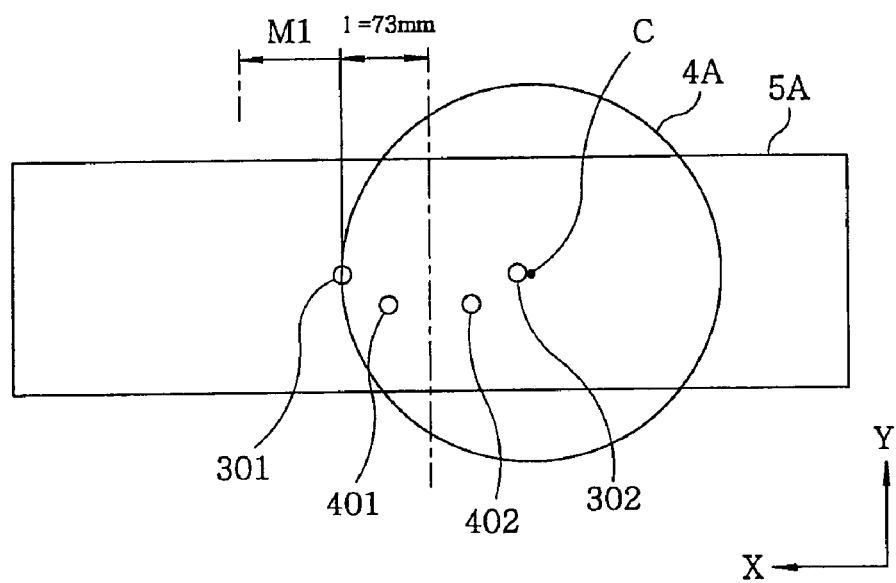

If the above configuration is employed, the movement region of the wafer chuck 4A is reduced. In order to align the wafer W with the probe needles 29, the alignment marks positioned at both end portions of the wafer W are checked by the micro cameras 301 and 302, or the needle traces on the wafer W are checked after the inspection. To do so, both end portions of the wafer W are positioned directly under the micro cameras 301 and 302. FIGS. 40A and 40B depict a movement of the wafer chuck 4A during the above operation. As can be seen from FIG. 40A, the wafer W is positioned under the alignment bridge 5A so that the central line 300 of the alignment bridge 5A coincides with the center C of the wafer W. In order to image the left region of the wafer W by the micro camera 301, the wafer chuck 4A needs to move in the X direction so that the left end portion of the wafer W can be positioned directly under the micro camera 301. At this time, the moving amount of the wafer chuck 4A in FIG. 40A corresponds to M1. If the wafer W has a diameter of about 300 mm, M1 is about 77 mm.

Figure 41:
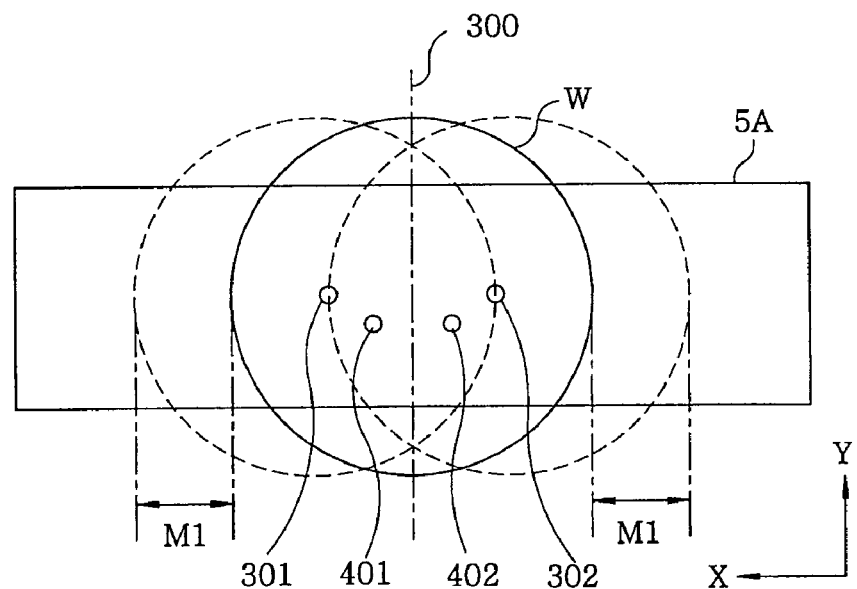
FIG. 41 explains an entire moving amount of a wafer W in an X direction in case of using the alignment bridge.

FIG. 41 illustrates the entire moving amount of the wafer W in the X direction. In a state where the center C of the wafer W is positioned on the central line 300 of the alignment bridge 5A, the moving amount of the wafer W to the right or the left area corresponds to M1, as shown in FIG. 41. Since the wafer W having a diameter of about 300 mm is used in this example, M1 is about 77 mm, and the entire moving amount of the wafer W is about 154 mm.

Figure 42:
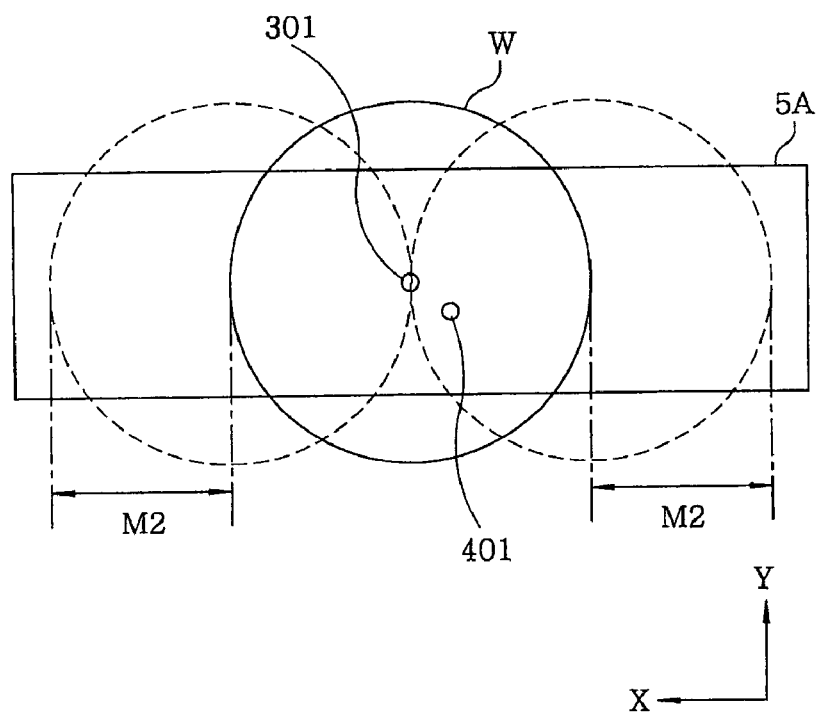
FIG. 42 explains an entire moving amount of the wafer W in the X direction in case of using an alignment bridge to which a single micro camera is attached.

FIG. 42 shows a case where a single micro camera 301 is attached to the alignment bridge 5A. In that case, after the center of the wafer W is positioned directly under the micro camera 301, left or right end portion of the wafer W is positioned directly under the micro camera 301 by moving the wafer chuck 4A in the X direction. Therefore, the moving amount M2 of the wafer W to the right or the left area corresponds to a radius of the wafer W, as depicted in FIG. 42. Since the wafer W having a diameter of 300 mm is used in this example, M2 is about 150 mm, and the entire moving amount of the wafer W is about 300 mm.

A plurality of points on the wafer W are imaged to obtain a relationship between ideal coordinates on the wafer W (coordinates of an electrode pad of each chip which has an origin of the wafer center) and actual coordinates in the driving system of the wafer chuck 4A (the number of pulses of the encoder in the motor which is required to move the wafer W by a specific amount in the X and Y directions). The plurality of points correspond to five points including, e.g., the center of the wafer W and four alignment marks positioned on the circumference of the chip where the circumference intersects with dicing lines passing through the diameters of the wafer W in the X and Y directions. Imaging the five points for the alignment is assigned to the micro cameras 301 and 302, so that the moving amount or the moving time of the wafer chuck 4A can be reduced compared to the case of using a single micro camera.

Figure 43:
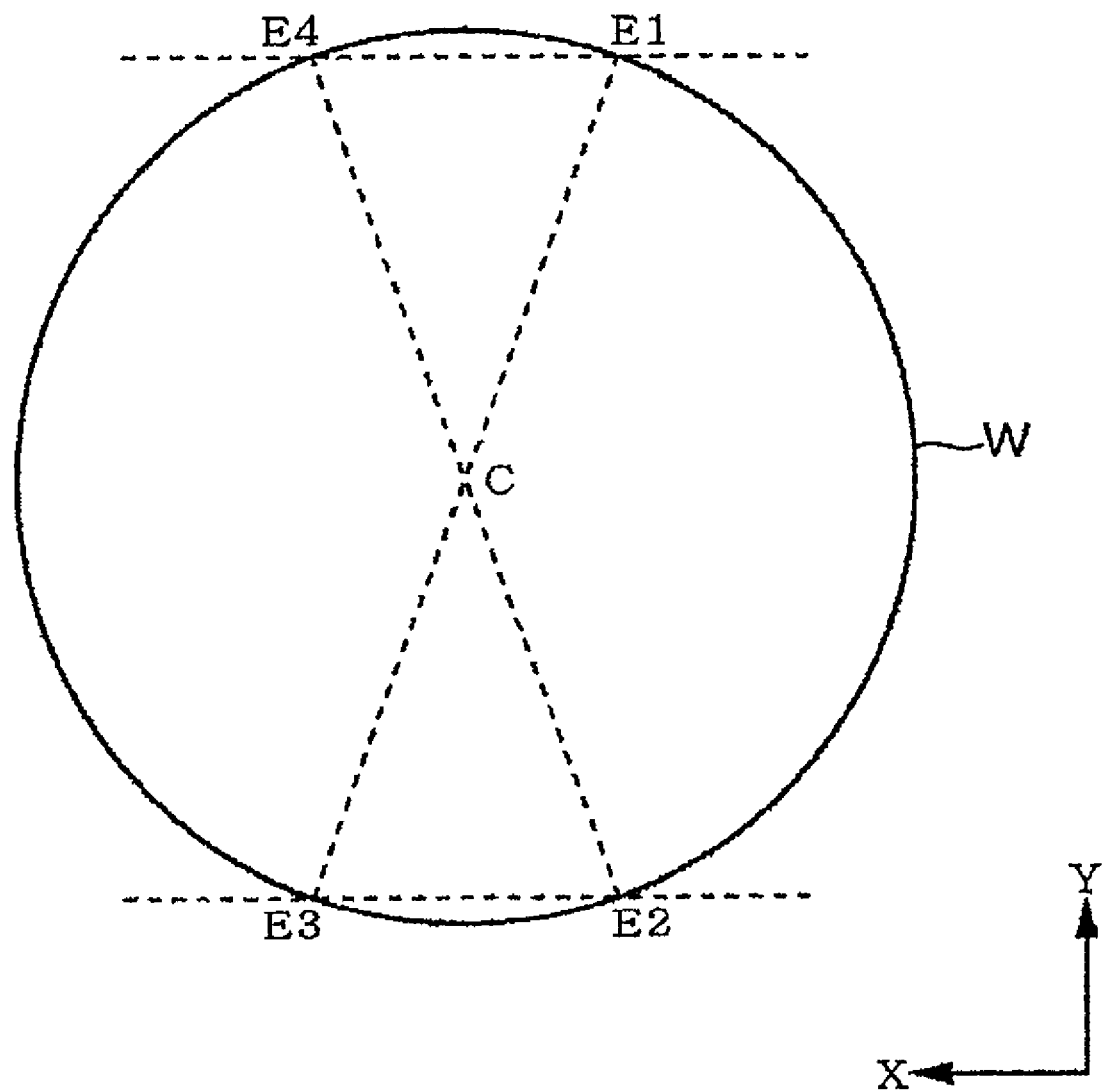
FIG. 43 explains a method of using the micro camera of the alignment bridge.
Figure 44A:
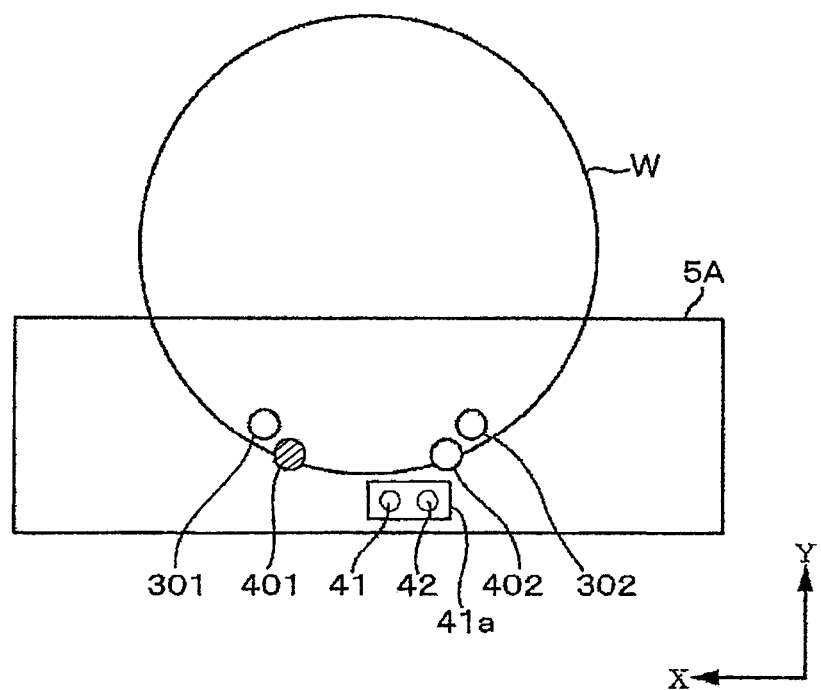
FIGS. 44A and 44B explain a method of using the micro camera of the alignment bridge.
Figure 44B:
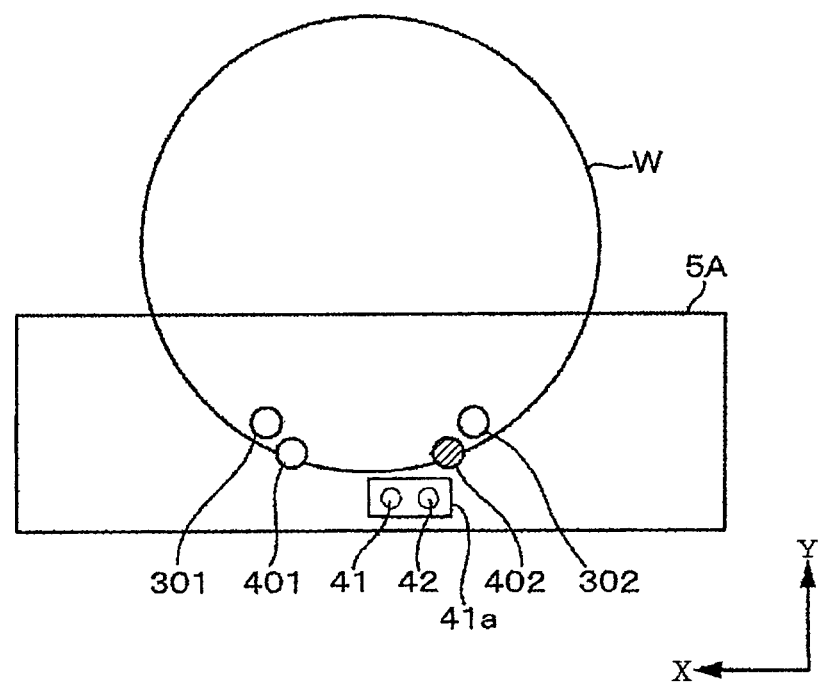
Figure 45A:
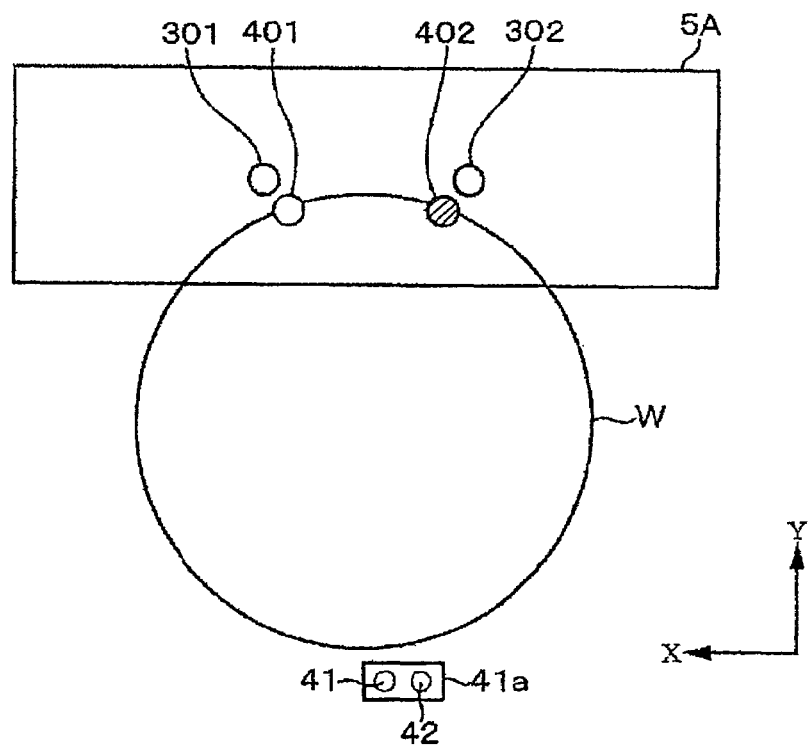
FIGS. 45A and 45B explain a method of using the micro camera of the alignment bridge.
Figure 45B:
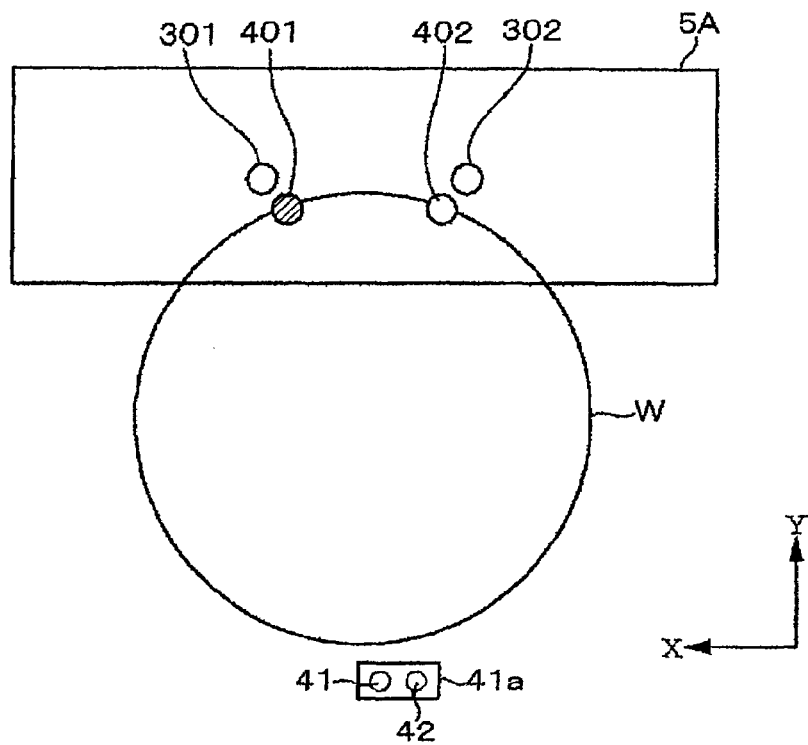

Hereinafter, the method for using the micro cameras 401 and 402 will be described with reference to FIGS. 43 to 45B. Referring to FIG. 43, the coordinates of four points E1 to E4 of the wafer W are obtained by imaging the four points E1 to E4 and, also, an intersection point between a line connecting two points E2 and E4 and a line connecting two points E1 and E3 is obtained. This intersection point corresponds to a central point (central coordinates) C of the wafer W. Further, the length of the line connecting the points E1 and E3 (or the points E2 and E4) corresponds to a diameter of the wafer W. Even when the wafer W has a diameter of, e.g., 300 mm, the actual diameter of the wafer W may be slightly different. In order to obtain a precise map (the coordinates of the electrode pads) of the chips on the wafer W, the coordinates of the center of the wafer W and the diameter of the wafer W need to be calculated. Moreover, one more reason for obtaining the coordinates of the center of the wafer W is because the registered positions of the electrode pads of the chips on the coordinates on the wafer are stored as relative positions with respect to the coordinates of the center of the wafer W.

As shown in FIG. 43, the points E2 and E3 are spaced from each other by a predetermined distance. The points E1 and E4 correspond to the intersection points obtained by moving a segment between the points E2 and E3 in the Y direction by way of moving the wafer W in the Y direction so that the segment can meet the circumference of the wafer W. In this example, the positions of the points E2 and E3 are obtained by sequentially imaging lower right and left portions of the wafer W with the use of the micro cameras 401 and 402, as can be seen from FIGS. 44A and 44B. Next, the wafer W moves in the Y direction and, then, upper right and left portions of the wafer W are sequentially imaged by the micro cameras 401 and 402, as described in FIGS. 45A and 45B. As a result, the positions of the points E1 and E4 are obtained.

Meanwhile, if there is provided a single micro camera, the chuck needs to move to positions corresponding to the four points on the wafer W sequentially. However, in this example, a pair of the two points E1 and E3 (or E2 and E4) can be almost simultaneously checked by shifting the micro cameras 401 and 402. Therefore, the wafer chuck 4A needs to move in the Y direction only once, after the two points E1 and E3 are checked. Accordingly, the four points on the circumference of the wafer W can be imaged in a short period of time. When the two micro cameras 401 and 402 are used, they are preferably provided to be symmetrical with respect to the central line 300. This is because when imaging the right and the left region of the wafer W is assigned to the micro cameras 401 and 402, the movement region of the wafer chuck 4A becomes symmetric with respect to the central line 300. Therefore, if this movement region is overlapped with the movement region in which the wafer W is imaged by the micro cameras 301 and 302, the movement region of the wafer chuck 4A is reduced compared to that obtained when they are asymmetric. The arrangement of the micro cameras 401 and 402 may be asymmetric with respect to the central line 300.

The micro cameras 301 and 302 have magnification converters provided on an optical path of an optical system. By controlling the magnification converters, it is possible to obtain a view (middle view) slightly smaller than the magnification of the high magnification camera. The magnification of the high magnification camera enables a needle trace on a single electrode pad to be checked. When the operator needs to check the needle trace on the electrode pad after the inspection, the needle trace cannot be seen by the micro cameras 401 and 402. Moreover, the electrode pads can be checked only one by one by the micro cameras 301 and 302, requiring a long period of time. Accordingly, a plurality of electrode pads can be monitored at a time by the middle view, and the existence/non-existence of the needle trace can be effectively checked. Such a middle view can also be used for imaging, e.g., the five points for alignment on the wafer W.

As set forth above, when two pairs of micro cameras are used, the moving amount of the wafer chuck 4A at which the wafer W is aligned with the probe needles 29 decreases compared to the case of using one pair of micro cameras. As a consequence, a throughput can be improved and, also, the apparatus can be scaled down. In case of the apparatus that the moving amount of the wafer chuck is small, it is not possible to check the entire wafer by one pair of micro cameras. However, the present invention can be applied to such apparatus by using two pairs of micro cameras.

While the invention has been shown and described with respect to the embodiments, it will be understood by those skilled in the art that various changes and modification may be made without departing from the scope of the invention as defined in the following claims.

What is claimed is:

1. A probe apparatus for inspecting a plurality of chips to be inspected by mounting on a horizontally and vertically movable substrate mounting table a substrate on which the chips are arranged and then contacting probes of a probe card with electrode pads of the chips, the probe apparatus comprising:
- a loader unit for loading the substrate; and
- a probe apparatus main body, provided near the loader unit, for inspecting the chips of the substrate,
- wherein the loader unit includes: a first and a second loading port which mount therein two carriers such that transfer opening are spaced apart opposite to each other, the carriers having therein a plurality of substrates and being loaded from the outside; and a substrate transfer mechanism having a rotation center between the first and the second loading port, the substrate transfer mechanism being rotatable about a vertical axis and movable back and forth and up and down,
- wherein the probe apparatus main body includes a first and a second inspection unit disposed in accordance with the arrangement of the first and the second loading port and provided at both sides of a horizontal line perpendicular to a line which connects the first and the second loading port and passes through the rotation center,
- wherein each of the inspection units is provided with the substrate mounting table, the probe card and an imaging unit having a substrate imaging device which has a downward view to take an image of a surface of the substrate and is movable horizontally at a height position between the substrate mounting table and the probe card,
- wherein the substrate transfer mechanism is constructed to directly transfer the substrate between the substrate mounting tables and the carriers mounted in the first and the second loading port,
- and wherein position of the imaging unit at which the substrate is imaged, position of the substrate mounting table at which the substrate is transferred and position of the probe card in the first inspection unit are symmetrical with those in the second inspection unit with respect to the horizontal line, respectively.

2. The probe apparatus of claim 1, wherein, in each of the first and the second inspection unit, the position of the imaging unit at which the substrate is imaged and the position of the probe card are arranged in accordance with the arrangement of the first and the second loading port, and the position of the substrate mounting table at which the substrate is transferred is closer to the horizontal line, compared to the position of the imaging unit at which the substrate is imaged and the position of the probe card.

3. The probe apparatus of claim 1, wherein, in each of the first and the second inspection unit, the position of the imaging unit at the substrate is imaged and the position of the probe card are arranged in perpendicular to the arrangement of the first and the second loading port, and the position of the substrate mounting table at which the substrate is transferred is closer to the horizontal line, compared to the position of the imaging unit at which the substrate is imaged and the position of the probe card.

4. The probe apparatus of claim 1, wherein the substrate transfer mechanism has three substrate supporting members, each being independently movable back and forth, and receives two substrates to be inspected from the carriers and sequentially transfers the two substrates to the substrate mounting tables of the first and the second inspection unit.

5. The probe apparatus of claim 4, further comprising a unit for selecting, when a substrate unloaded from one of the two carriers is mounted on one of the arms of the substrate transfer mechanism, a function of unloading a substrate from the other carrier by using another arm before the substrate is loaded into the inspection unit.

6. The probe apparatus of claim 1, wherein the substrate transfer mechanism has a vertically movable rotation stage for supporting and rotating a to-be-inspected substrate loaded from the carrier; and a detection unit for detecting a circumference of the substrate rotating by the rotation stage,
wherein the rotation stage rotates the substrate to set it in a predetermined orientation based on the detection result of the detection unit.

7. The probe apparatus of claim 1, wherein the substrate imaging device has at least one low magnification camera for imaging a wide area of the substrate surface and a plurality of high magnification cameras for imaging a narrow area of the substrate surface.

8. The probe apparatus of claim 7, wherein the high magnification cameras are arranged at least at three locations.

9. The probe apparatus of claim 7, wherein the high magnification cameras are arranged at two locations.

10. The probe apparatus of claim 9, wherein the low magnification cameras are arranged at two positions.

11. The probe apparatus of claim 10, wherein the two low magnification cameras are disposed to be symmetrical with respect to a straight line connecting points spaced apart at a same distance from the two high magnification cameras.

12. The probe apparatus of claim 1, wherein the electrode pads of the chips of the substrate are made to contact with the probes of the probe card at a time, or are split into four regions to be sequentially brought into contact with the probes.

13. The probe apparatus of claim 1, wherein the substrate mounting table has a probe imaging device having an upward view, and wherein the probe imaging unit is provided with a low magnification camera for imaging a wide area of the probe card and a plurality of high magnification cameras for imaging a narrow area of the probe card.

14. The probe apparatus of claim 1, wherein the substrate mounting table has a probe imaging device having an upward view, and wherein the probe imaging unit is provided with a first and a second imaging unit, each having a low magnification camera for imaging a wide area of the probe card and a plurality of high magnification cameras for imaging a narrow area of the probe card.

15. The probe apparatus of claim 1, wherein the substrate mounting table has a probe imaging device having an upward view, and wherein a center of a movement region of the substrate mounting table when the substrate is imaged by the substrate imaging device coincides with or is positioned near a center of a movement region of the substrate mounting table when the probe is imaged by the probe imaging device.

16. The probe apparatus of claim 1, wherein, to the opposite side of the loader unit against the probe apparatus main body, another probe apparatus main body having a same configuration of the probe apparatus main body is connected, the probe apparatus main bodies being symmetrical with respect to the rotation center of the substrate transfer mechanism.

17. A probe system comprising two probe apparatuses described in claim 1, wherein the probe apparatuses are arranged symmetrically with each other while the probe apparatus main bodies thereof are disposed adjacent to each other.

* * * * *